(12) United States Patent
Lee et al.

(10) Patent No.: US 11,862,645 B2
(45) Date of Patent: Jan. 2, 2024

(54) DISPLAY DEVICE

(71) Applicant: Samsung Display Co., Ltd., Yongin-si (KR)

(72) Inventors: So Young Lee, Asan-si (KR); Dae-Hyun Noh, Hwaseong-si (KR); Hyun-Chol Bang, Seongnam-si (KR); Sang Won Seo, Cheonan-si (KR); Ju Hee Hyeon, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/147,210

(22) Filed: Jan. 12, 2021

(65) Prior Publication Data

US 2021/0134842 A1    May 6, 2021

Related U.S. Application Data

(63) Continuation of application No. 15/655,482, filed on Jul. 20, 2017, now Pat. No. 10,910,409.

(30) Foreign Application Priority Data

Dec. 2, 2016  (KR) .................. 10-2016-0163571

(51) Int. Cl.
*H01L 27/12*  (2006.01)
*G02F 1/1345*  (2006.01)
(Continued)

(52) U.S. Cl.
CPC ........ *H01L 27/124* (2013.01); *G02F 1/13458* (2013.01); *H01L 24/06* (2013.01);
(Continued)

(58) Field of Classification Search
CPC ............. H01L 27/3276; H01L 27/3262; H01L 27/124; H01L 24/06; H01L 24/16;
(Continued)

(56) References Cited

U.S. PATENT DOCUMENTS 6,700,636 B2   3/2004   Kim et al.
7,352,426 B2   4/2008   Abe et al.
(Continued)

FOREIGN PATENT DOCUMENTS

EP      1369737      12/2003
JP    2002202522     7/2002
(Continued)

OTHER PUBLICATIONS

Extended European Search Report—European Patent Application No. 17190625.8 dated Mar. 16, 2018, citing references listed within.
(Continued)

*Primary Examiner* — Steven B Gauthier
*Assistant Examiner* — Khatib A Rahman
(74) *Attorney, Agent, or Firm* — CANTOR COLBURN LLP

(57) ABSTRACT

A display device includes a substrate that includes a display area and a pad area, and a plurality of data pads that are provided on the pad area of the substrate and arranged along a first direction and a second direction, where the plurality of data pads includes a first data pad, a second data pad that is disposed adjacent to the first data pad along the first direction, a third data pad that is disposed adjacent to the first data pad along the second direction, and a fourth data pad that is disposed adjacent to the second data pad along the second direction, and the first data pad and the second connection wire are respectively disposed in different layers.

10 Claims, 19 Drawing Sheets

(51) Int. Cl.
*H01L 23/00* (2006.01)
*G02F 1/1362* (2006.01)
*H10K 59/131* (2023.01)
*H10K 59/121* (2023.01)

(52) U.S. Cl.
CPC ............ *H01L 24/16* (2013.01); *G02F 1/1345* (2013.01); *G02F 1/136254* (2021.01); *H01L 2224/0401* (2013.01); *H01L 2224/06135* (2013.01); *H01L 2224/16145* (2013.01); *H01L 2924/1426* (2013.01); *H10K 59/1213* (2023.02); *H10K 59/131* (2023.02)

(58) Field of Classification Search
CPC ... H01L 2224/0401; H01L 2224/06135; H01L 2224/16145; H01L 27/3248; H01L 27/1244; H01L 51/0031; H01L 2251/568; H01L 2924/1426; G02F 1/1345; G02F 1/13458; G02F 1/136254; G09G 3/006
See application file for complete search history.

(56) References Cited

U.S. PATENT DOCUMENTS

| | | | |
|---|---|---|---|
| 7,414,692 B2 | 8/2008 | Kim et al. | |
| 7,821,588 B2* | 10/2010 | Chang | G02F 1/1345 |
| | | | 349/149 |
| 8,148,779 B2 | 4/2012 | Jeong et al. | |
| 8,305,312 B2* | 11/2012 | Kim | G02F 1/1368 |
| | | | 345/87 |
| 8,796,689 B2 | 8/2014 | Koo et al. | |
| 9,012,931 B2* | 4/2015 | Chung | G02F 1/13458 |
| | | | 257/40 |
| 9,035,313 B2 | 5/2015 | Jeong et al. | |
| 9,153,599 B2 | 10/2015 | Koo et al. | |
| 9,401,354 B1 | 7/2016 | Bae | |
| 10,566,459 B2 | 2/2020 | Yamazaki et al. | |
| 2004/0046905 A1* | 3/2004 | Hong | G02F 1/136227 |
| | | | 349/43 |
| 2006/0139551 A1 | 6/2006 | Kimura | |
| 2008/0246909 A1* | 10/2008 | Jung | G02F 1/1345 |
| | | | 349/149 |
| 2009/0153008 A1 | 6/2009 | Yanagisawa et al. | |
| 2010/0090715 A1* | 4/2010 | Chang | G02F 1/1362 |
| | | | 324/750.01 |
| 2010/0149473 A1 | 6/2010 | Guo et al. | |
| 2011/0101335 A1 | 5/2011 | Yamazaki et al. | |
| 2012/0044432 A1* | 2/2012 | Yeh | G02F 1/13458 |
| | | | 349/33 |
| 2013/0146931 A1* | 6/2013 | Liu | H01L 27/0688 |
| | | | 438/22 |
| 2014/0098495 A1* | 4/2014 | Jeon | H05K 7/20136 |
| | | | 361/695 |
| 2014/0117320 A1 | 5/2014 | Jung | |
| 2014/0145153 A1 | 5/2014 | Klm et al. | |
| 2014/0367682 A1 | 12/2014 | Yamazaki et al. | |
| 2015/0091013 A1* | 4/2015 | Bae | H01L 27/3276 |
| | | | 257/72 |
| 2015/0123882 A1* | 5/2015 | Hsu | G09G 3/006 |
| | | | 345/55 |
| 2016/0190179 A1* | 6/2016 | Kim | G02F 1/13458 |
| | | | 257/774 |
| 2016/0274387 A1 | 9/2016 | Zheng et al. | |
| 2016/0372029 A1* | 12/2016 | Park | G09G 3/3233 |

FOREIGN PATENT DOCUMENTS

| | | |
|---|---|---|
| JP | 2005091962 | 4/2005 |
| JP | 2006058721 | 3/2006 |
| JP | 2006209089 | 8/2006 |
| JP | 2008065152 | 3/2008 |
| JP | 2010016348 | 1/2010 |
| JP | 2011129554 | 6/2011 |
| JP | 2016197735 | 11/2016 |
| JP | 2005181706 | 7/2021 |
| KR | 20070122075 A | 12/2007 |
| KR | 20130031559 A | 3/2013 |
| KR | 1020160090980 | 8/2016 |
| KR | 20160122901 A | 10/2016 |
| TW | 201022779 | 6/2010 |

OTHER PUBLICATIONS

Taiwanese Office Action—Taiwanese Patent Application No. 106140106 dated Apr. 8, 2021, citing references listed within.
Japanese Office Action—Japanese Application No. 2017-231761 dated Jul. 27, 2021, citing references listed within.

* cited by examiner

DISPLAY DEVICE

This application is a continuation of U.S. patent application Ser. No. 15/655,482, filed on Jul. 20, 2017, which claims priority to Korean Patent Application No. 10-2016-0163571 filed on Dec. 2, 2016, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

A display device that displays an image includes a liquid crystal display ("LCD"), an organic light emitting diode ("OLED") display, and the like. Such a display device generally includes a display panel where a plurality of pixels is provided and a driver that supplies a signal to the plurality of pixels. A plurality of gate lines and a plurality of data lines are provided in the display panel, and each pixel is connected with a corresponding gate line and a corresponding data line and receives a predetermined signal. The driver may include a gate driver and a data driver where the gate line receives a gate signal from the gate driver and the data line receives a data signal from the data driver.

The drivers may be provided as integrated circuit ("IC") chips, and the IC chips may be attached to one edge of the display panel.

A pad may be provided in the display panel for a connection with the driver. Such a pad may be disposed at an edge of the display panel, and may be parallel with the edge of the display panel. As a resolution of the display device is increased, the number of pads is increased such that the pads cannot be disposed in one row. Accordingly, the pads may be disposed in two rows. In this case, a connection wire that is connected with pads that are disposed in the second row may be located between two adjacent pads that are disposed in the first row.

SUMMARY

In order to prevent a connection wire that connects a pad that is disposed in a first row and a pad that is disposed in a second row from being short-circuited, the connection wire of the pads in the first row and the connection wire of the pads in the second row need to be disposed apart from each other by a predetermined distance. Accordingly, an entire area where the pads are formed is increased.

The described technology has been made in an effort to provide a display device that can reduce a pad area.

A display device according to an exemplary embodiment includes a substrate that includes a display area and a pad area, a plurality of data pads that are provided on the pad area of the substrate and arranged along a first direction and a second direction, and connection wires that are respectively connected with the plurality of data pads, where the plurality of data pads include a first data pad, a second data pad that is disposed adjacent to the first data pad along the first direction, a third data pad that is disposed adjacent to the first data pad along the second direction, and a fourth data pad that is disposed adjacent to the second data pad along the second direction, the connection wires include a first connection wire that is connected with the first data pad, and a second connection wire that is connected with the second data pad and disposed between the first data pad and the third data pad, and the first data pad and the second connection wire are respectively disposed in different layers.

In an exemplary embodiment, the third data pad and the second connection wire may be respectively disposed in different layers.

In an exemplary embodiment, the first data pad and the second data pad may be respectively disposed in different layers.

In an exemplary embodiment, the first data pad and the third data pad may be disposed in the same layer, and the second data pad and the fourth data pad may be disposed in the same layer.

In an exemplary embodiment, the first connection wire may be disposed in the same layer as that of the first data pad and may be directly connected with the first data pad, and the second connection wire may be disposed in the same layer as that of the second data pad and may be directly connected with the second data pad.

In an exemplary embodiment, the display device may further include a first gate insulation layer and a second gate insulation layer that are disposed on the substrate, where the first data pad and the third data pad may be disposed between the first gate insulation layer and the second gate insulation layer, and the second data pad and the fourth data pad may be disposed on the second gate insulation layer.

In an exemplary embodiment, the display device may further include a plurality of gate lines and a plurality of data lines that are provided on the display area of the substrate, where the plurality of connection wires are connected with the plurality of data lines.

In an exemplary embodiment, the display device may further include a test circuit portion that is provided on the pad area of the substrate, and a plurality of test wires that connect the plurality of data pads and the test circuit portion, where the plurality of test wires may include a first test wire that connects the first data pad and the test circuit portion with each other, and a second test wire that connects the second data pad and the test circuit portion with each other.

In an exemplary embodiment, the first test wire may be disposed in the same layer as that of the first data pad and is directly connected with the first data pad, and the second test wire may be disposed in the same layer as that of the second data pad and is directly connected with the second data pad.

In an exemplary embodiment, the display device may further include a semiconductor layer that is provided on the display area of the substrate, a first gate insulation layer and a second gate insulation layer that are disposed on the semiconductor layer, a first gate wire that is provided between the first gate insulation layer and the second gate insulation layer, and a second gate wire that is provided on the second gate insulation layer.

In an exemplary embodiment, the first data pad may be provided in the same layer as that of the first gate wire, and the second data pad may be provided in the same layer as that of the second gate wire.

In an exemplary embodiment, the first data pad may include the same material as that of the first gate wire, and the second data pad may include the same material as that of the second gate wire.

In an exemplary embodiment, the plurality of data pads may further include a fifth data pad that is disposed adjacent to the second data pad along the first direction, where the fifth data pad is provided in a different layer from that of the second data pad, and the fifth data pad is provided in the same layer as that of the first data pad.

In an exemplary embodiment, the plurality of data pads may further include a sixth data pad that is provided adjacent to the fifth data pad along the first direction, where the sixth data pad is provided in a different layer from that of the fifth data pad, and the sixth data pad is provided in the same layer as that of the second data pad.

In an exemplary embodiment, three of the plurality of connection wires may be provided between the first data pad and the third data pad.

In an exemplary embodiment, the second connection wire may overlap at least a part of the first data pad.

In an exemplary embodiment, the display device may further include dummy data pads that are provided adjacent to the plurality of data pads.

In an exemplary embodiment, the dummy data pads may be provided in the same layer as that of the plurality of data pads.

In an exemplary embodiment, the plurality of data pads may further include a third data pad that is provided adjacent to the second data pad along the first direction, and a fourth data pad that is provided adjacent to the first data pad along the second direction.

In an exemplary embodiment, the third data pad may be provided in a different layer from that of the second data pad, the third data pad may be provided in the same layer as that of the first data pad, the fourth data pad may be provided in a different layer from that of the first data pad, and the fourth data pad may be provided in the same layer as that of the second data pad.

According to the exemplary embodiment, adjacent pads are respectively disposed in different layers so that a short-circuit between the pads and connection wires can be prevented. Accordingly, a distance between pads and wires, a distance between wires, and a distance between pads can be reduced, thereby reducing the pad area.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
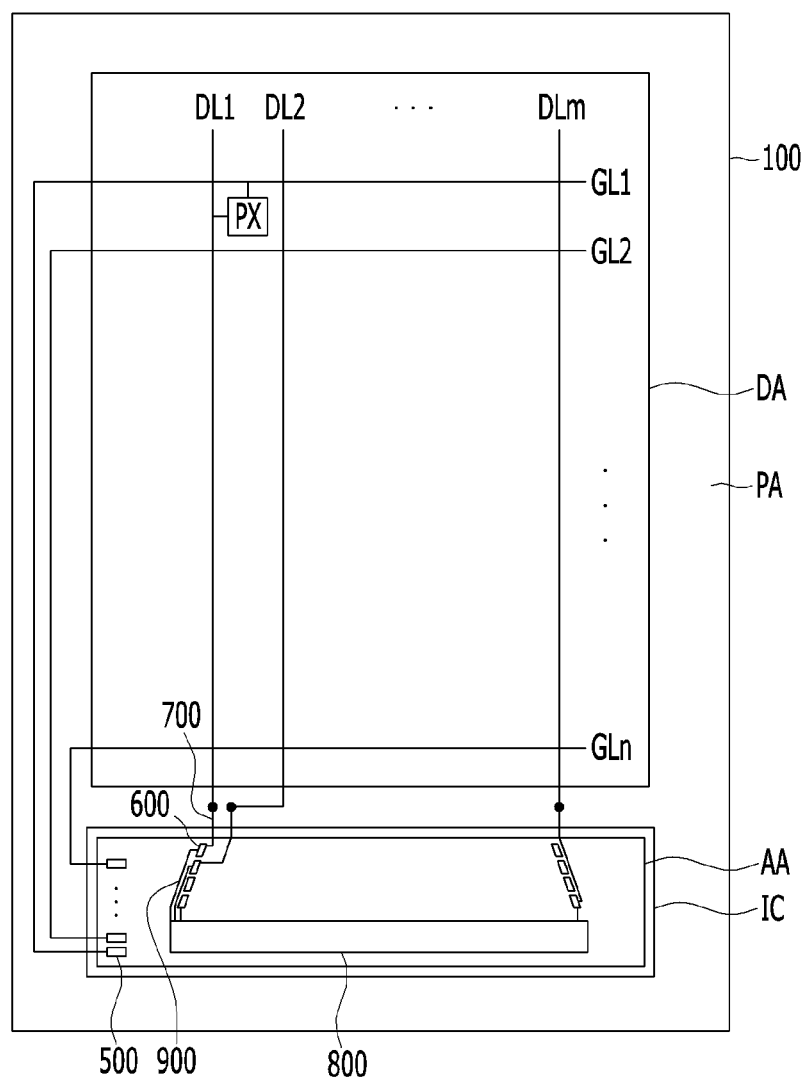
FIG. 1 is a top plan view of an exemplary embodiment of a display device.

Hereinafter, the invention will be described more fully with reference to the accompanying drawings, in which exemplary embodiments of the invention are shown. As those skilled in the art would realize, the described embodiments may be modified in various different ways, all without departing from the spirit or scope of the invention.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements.

In this specification, the phrase "in a plan view" means viewing a target portion from the top, and the phrase "on a cross-section" means viewing a cross-section formed by vertically cutting a target portion from the side.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or"

includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Referring to FIG. 1, a display device according to an exemplary embodiment will be described hereinafter.

FIG. 1 is a top plan view of a display device according to an exemplary embodiment.

As shown in FIG. 1, a display device 100 according to an exemplary embodiment includes a display area DA and a peripheral area PA.

In an exemplary embodiment, the display device 100 may be provided as an organic light emitting diode ("OLED") display, for example. However, the invention is not limited thereto, and it may be provided as a liquid crystal display ("LCD") and the like.

The display area DA may be disposed at a center of the display device 100, and the peripheral area PA may surround the display area DA. However, the layout of the display area DA and the peripheral area PA is not limited thereto, and the peripheral area PA may be disposed at lateral edges of the display area DA. In an alternative exemplary embodiment, the peripheral area PA may be disposed in an upper edge or a lower edge of the display area DA.

A plurality of gate lines GL1 to GLn (where n is a natural number) are disposed in parallel with each other in the display area DA of the display device 100, and a plurality of data lines DL1 and DLm (where m is a natural number) are disposed in parallel with each other in the display area DA. The plurality of gate lines GL1 to GLn and the plurality of data lines DL1 to DLm are insulated from each other, and define the plurality of pixels PX by crossing each other. Each pixel PX is a minimum unit for displaying an image, and the plurality of pixels PX may be disposed in a matrix format. The plurality of pixel PX are connected with the gate lines GL1 to GLn and the data lines DL1 to DLm and receive predetermined signals therefrom.

The peripheral area PA of the display device 100 may include a pad area AA. The pad area AA is disposed in a lower edge of the display device 100, but the invention is not limited thereto. In an alternative exemplary embodiment, the pad area AA may be disposed at another edge of the display device 100 or may be disposed at lateral edges of the display device 100.

The pad area AA implies an area where a plurality of gate pads 500 that are respectively connected with the plurality of gate lines GL1 to GLn and a plurality of data pads 600 that are respectively connected with the plurality of data lines DL1 to DLm are provided.

The plurality of data lines DL1 to DLm may extend to the peripheral area PA, and the data lines DL1 to DLm and the data pads 600 may be connected with each other through connection wires 700. The connection wires 700 may be provided on different layers from the data lines DL1 to DLm. Insulation layers may be provided between the connection wires 700 and the data lines DL1 to DLm, a contact hole is provided in each insulation layer, and the connection wire 700 and the corresponding data lines DL1 to DLm may be connected with each other through the contact hole.

A test circuit portion 800 may be further provided in the pad area AA, and the test circuit portion 800 is connected with the plurality of data pads 600. The test circuit portion 800 and the data pads 600 may be connected through test wires 900.

In an exemplary embodiment, an integrated circuit ("IC") chip where the gate driver and the data driver are installed may be attached to the pad area AA, and the IC chip may be electrically connected with the plurality of gate pads 500 and the plurality of data pads 600 by an anisotropic conductive film ("ACF"), for example.

The pad area of the display device according to the illustrated exemplary embodiment will now be described in detail with reference to FIG. 2.

Figure 2:
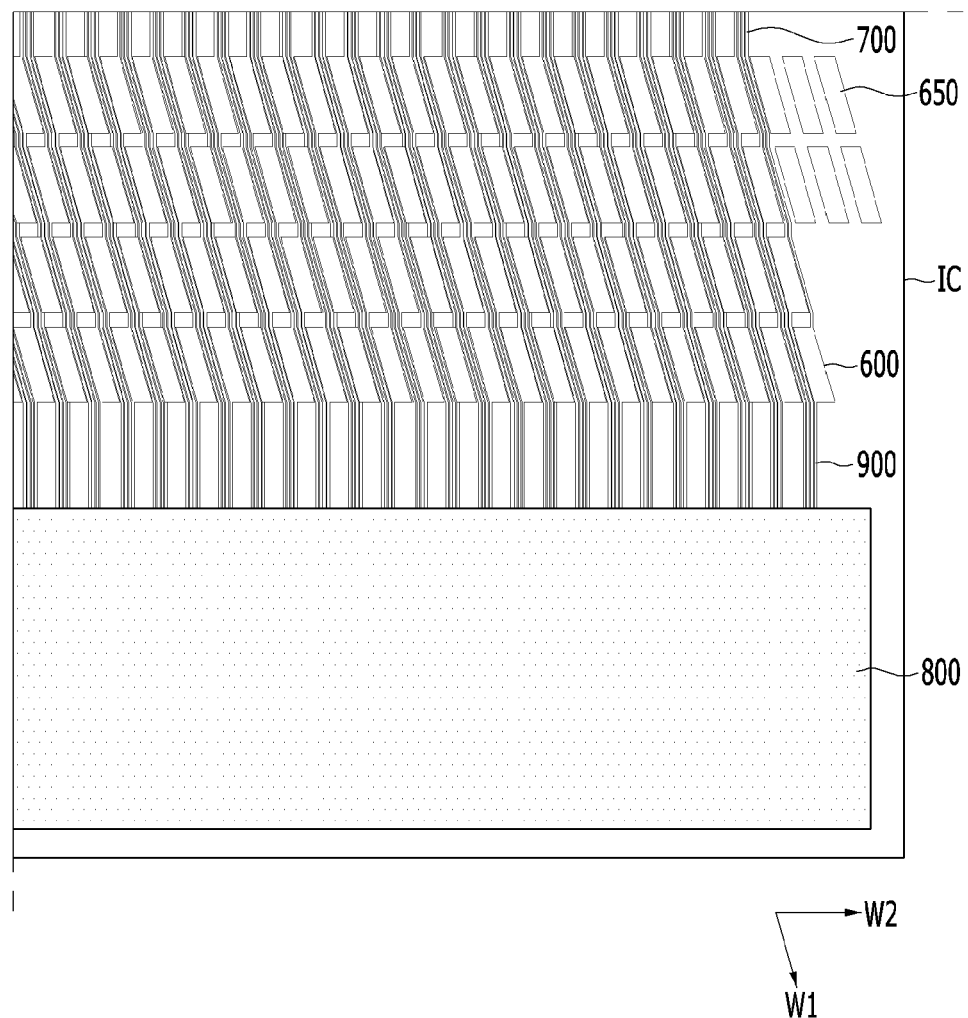
FIG. 2 is a top plan view that partially illustrates the exemplary embodiment of a pad area of the display device.

FIG. 2 is a top plan view that illustrates a part of the pad area of the display device according to the exemplary embodiment.

As shown in FIG. 2, the plurality of data pads 600 are disposed in the pad area AA (refer to FIG. 1) of the display device 100. The plurality of data pads 600 may be aligned along a first direction W1 and a second direction W2. The second direction W2 may be a horizontal direction, and the first direction W1 may be a direction that is inclined at a predetermined angle with respect to the second direction W2. However, the invention is not limited thereto, and the first direction W1 may be a vertical direction. That is, the first direction W1 and the second direction W2 may be perpendicular to each other.

The connection wire 700 or the test wire 900 is disposed between data pads 600 that are adjacent to each other in the second direction W2. One end of the connection wire 700 is connected with the data pad 600, and the other end of the connection wire 700 is connected with the data lines DL1 to DLm (refer to FIG. 1) that are disposed in the display area DA (refer to FIG. 1). That is, the connection wires 700 may connect the data pads 600 and the data lines DL1 to DLm to each other. The test wires 900 are connected with the data pads 600 and the test circuit portion 800.

The test circuit portion 800 is a circuit device that determines whether the display device 100 normally operates by applying a predetermined signal to the display device 100. That is, the test circuit portion 800 generates a predetermined signal and applies the signal to the test wires 900, and the test wires 900 may supply the signal to the data lines DL1 to DLm through the data pads 600.

One data pad 600 is connected with one connection wire 700 and one test wire 900. In the illustrated exemplary embodiment, the data pads 600 are aligned in four rows. Three wires 700 and 900 may be disposed between data pads 600 that are adjacent to each other in the second direction W2. Three connection wires 700 may be disposed between adjacent data pads 600 that are disposed in the first row. Two connection wires 700 and one test wire 900 may be disposed between adjacent data pads 600 that are disposed in the second row. One connection wire 700 and two test wires 900 may be disposed between adjacent data pads 600 that are disposed in the third row. Three test wires 900 may be disposed between adjacent data pads 600 that are disposed in the fourth row.

Dummy data pads 650 may be further provided in the pad area AA of the display device 100. The dummy data pad 650 may have substantially the same shape as that of the data pad 600. The dummy data pads 650 are floated rather than being connected with wires. Thus, no signal is applied to the dummy data pads 650. The dummy data pads 650 may be disposed in the same layer as the data pads 600. The dummy data pad 650 may be used as an alignment key when the IC chip is attached to the pad area AA.

Referring to FIGS. 3 to 9, the data pads of the display device and wires that are connected to the data pads according to the exemplary embodiment will be described in detail with reference to FIGS. 3 to 9.

Figure 3:
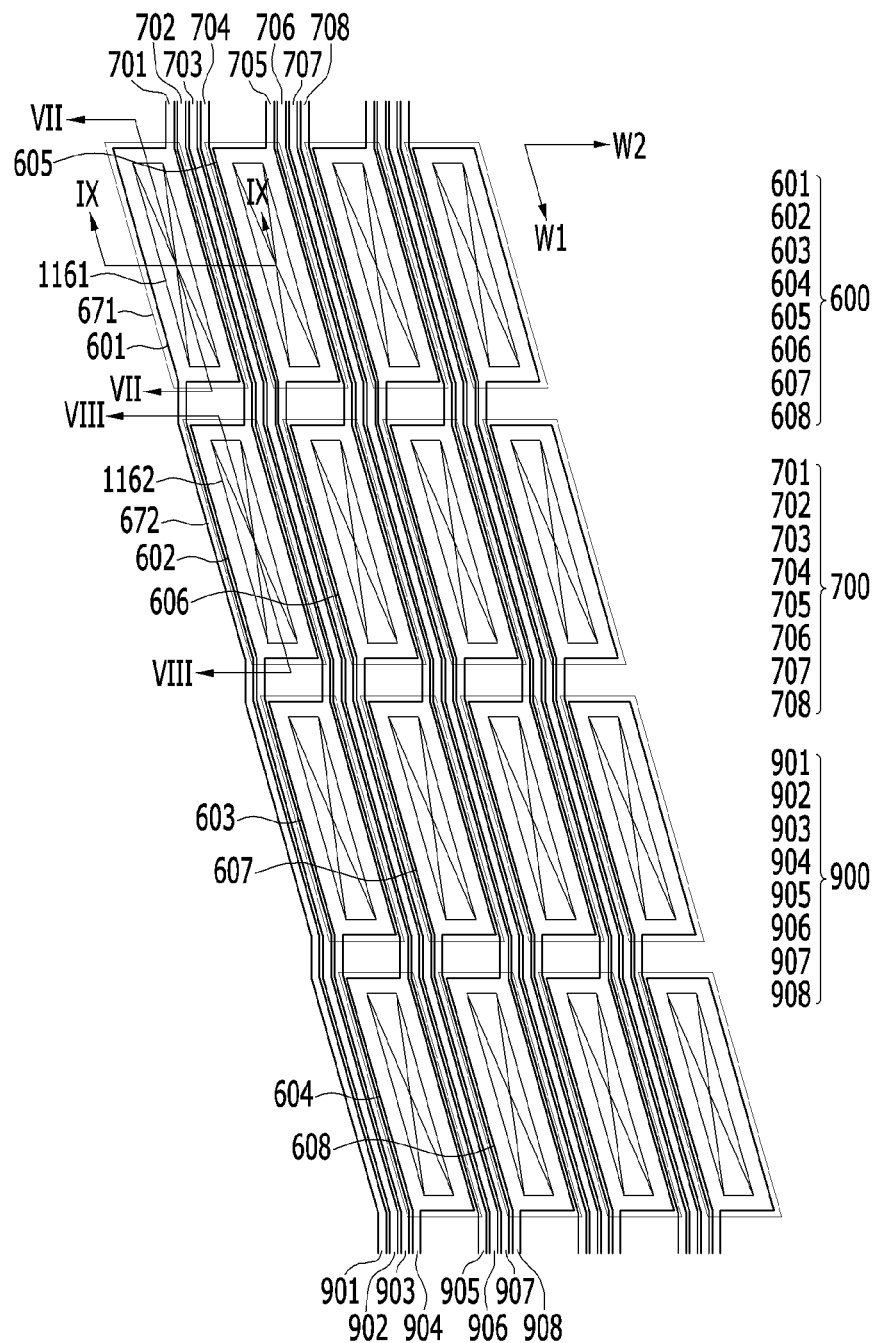
FIG. 3 is an enlarged top plan view that illustrates the exemplary embodiment of a part of the pad area of the display device.
Figure 4:
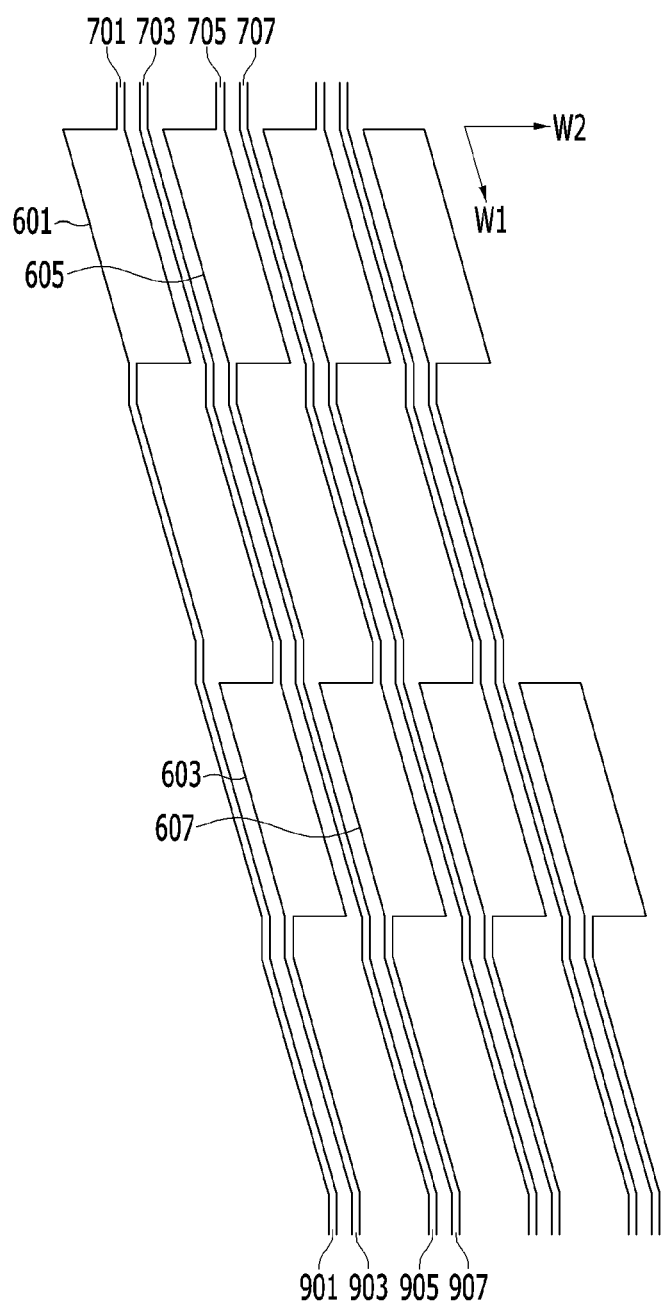
FIG. 4 is a top plan view of partial layers of FIG. 3.
Figure 5:
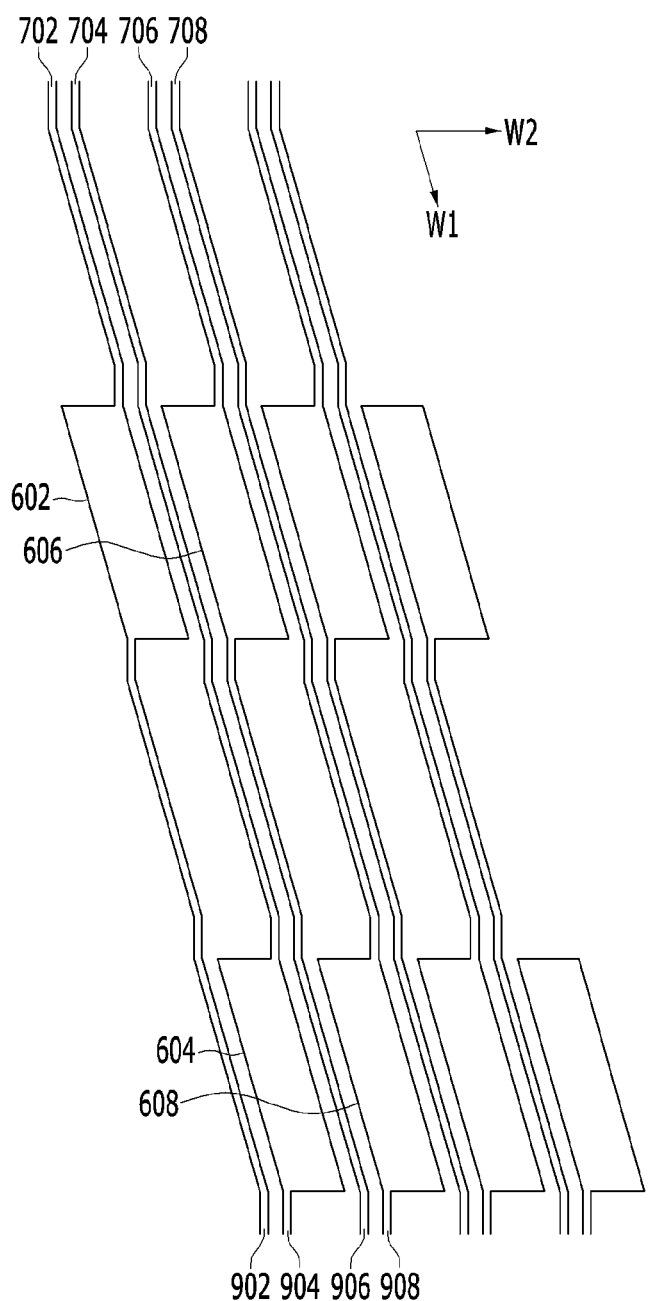
FIG. 5 is a top plan view of another layer of FIG. 3.
Figure 6:
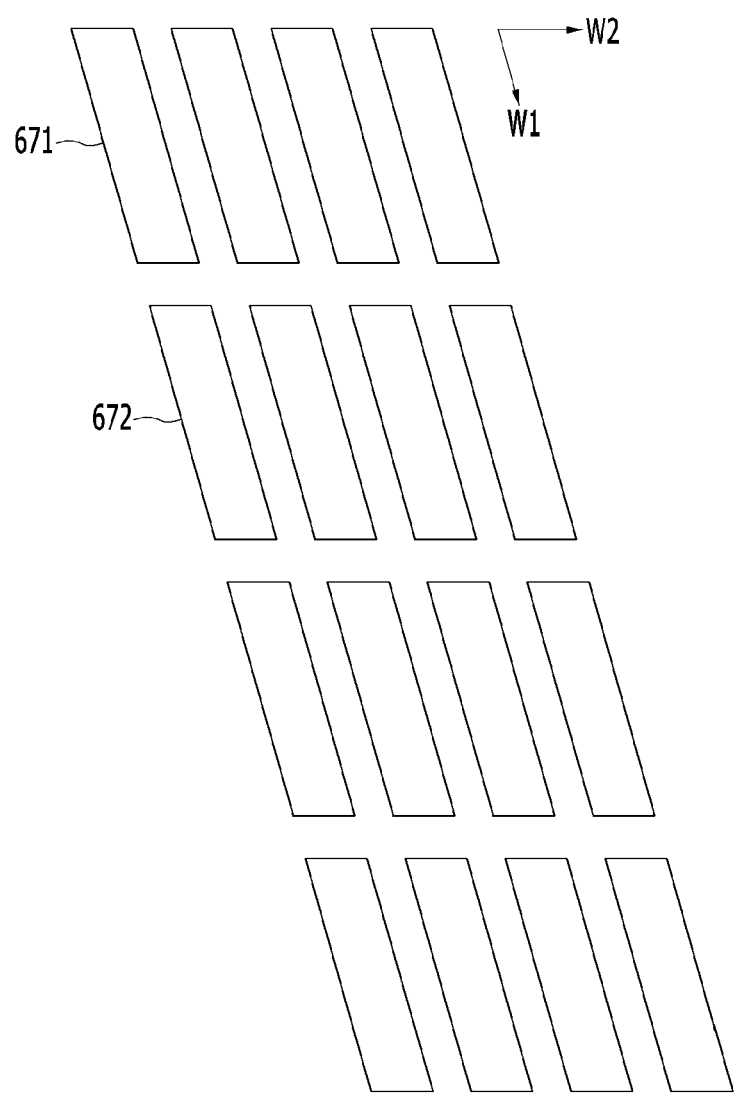
FIG. 6 is a top plan view of yet another layer of FIG. 3.
Figure 7:
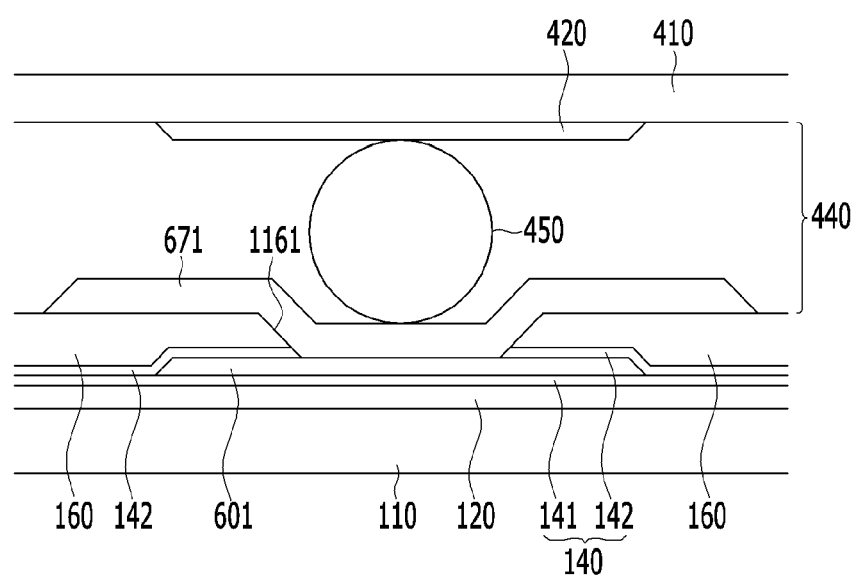
FIG. 7 is a cross-sectional view of FIG. 3, taken along line VII-VII.
Figure 8:
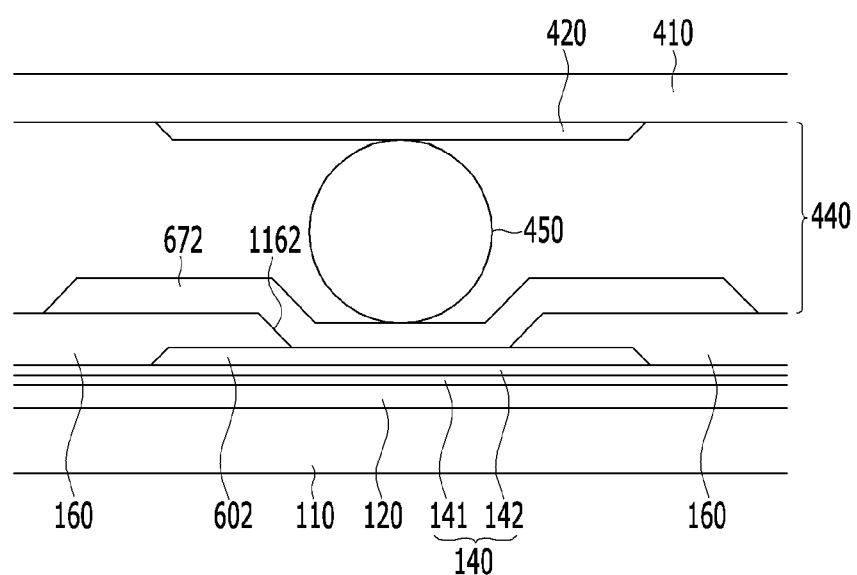
FIG. 8 is a cross-sectional view of FIG. 3, taken along line VIII-VIII.
Figure 9:
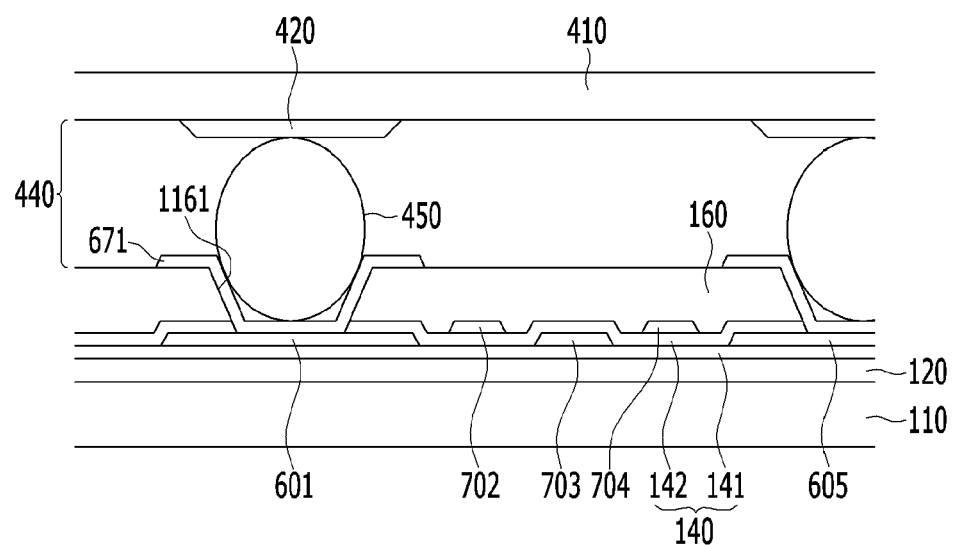
FIG. 9 is a cross-sectional view of FIG. 3, taken along line IX-IX.

FIG. 3 is an enlarged top plan view that illustrates a part of the pad area of the display device according to the exemplary embodiment, FIG. 4 is a top plan view of partial layers of FIG. 3, FIG. 5 is a top plan view of other layers of FIG. 3, and FIG. 6 is a top plan view of still other layers of FIG. 3. FIG. 7 is a cross-sectional view of FIG. 3, taken along line VII-VII, FIG. 8 is a cross-sectional view of FIG. 3, taken along line VIII-VIII, and FIG. 9 is a cross-sectional view of FIG. 3, taken along line IX-IX.

As shown in FIG. 3, the plurality of data pads 600 are aligned in the first direction W1 and the second direction W2 in a pad area. The plurality of data pads 600 may be aligned in four rows, and four data pads 600 are aligned in each row in FIG. 3. FIG. 3 illustrates a part of the pad area, and four or more data pads 600 may be aligned in each row.

The plurality of data pads 600 includes a leftmost first data pad 601 in the first row and a leftmost second data pad 602 in the second row. The first data pad 601 and the second data pad 602 are disposed adjacent to each other along the first direction W1. The first data pad 601 and the second data pad 602 may be respectively disposed in different layers.

The first data pad 601 may have a quadrangular shape in a plan view, and may be substantially disposed in the shape of a parallelogram. Two sides of the parallelogram may be parallel with the first direction W1, and the other two sides thereof may be parallel with the second direction W2. The first data pad 601 is connected with a first connection wire 701 and a first test wire 901. The first connection wire 701 is directly connected with the first data pad 601, and particularly, may be connected with an upper edge of the first data pad 601. The first connection wire 701 may substantially extend in a vertical direction. The first test wire 901 is directly connected with the first data pad 601, and particularly, may be connected with a lower edge of the first data pad 601. The first test wire 901 may have a plurality of bent portions, and may alternately extend in the vertical direction and the first direction W1. The first data pad 601, the first connection wire 701, and the first test wire 901 are disposed in the same layers.

As shown in FIG. 7, a buffer layer 120 is provided on a substrate 110, and a gate insulation layer 140 is provided on the buffer layer 120.

In an exemplary embodiment, the buffer layer 120 may be provided as a single layer of a silicon nitride (SiNx) or a multilayer where a silicon nitride (SiNx) and a silicon oxide (SiOx) are stacked, for example. The buffer layer 120 serves to planarize a surface of the substrate 110 while preventing an unnecessary component such as an impurity or moisture from permeating. The buffer layer 120 may be disposed not only in a peripheral area PA (refer to FIG. 1) of the substrate 110 but also in a display area DA (refer to FIG. 1). That is, the buffer layer 120 may be disposed on the entire surface of substrate 110. However, the invention is not limited thereto, and in another exemplary embodiment, the buffer layer 120 may be omitted as necessary.

In an exemplary embodiment, the gate insulation layer 140 may include an inorganic insulation material such as a silicon oxide (SiOx), a silicon nitride (SiNx), a silicon oxynitride (SiON), a silicon oxyfluoride (SiOF), an aluminum oxide (AlOx), and the like, or an organic insulating material, for example, and may be provided as a single layer or a multilayer that includes at least one of these materials. In an exemplary embodiment, the gate insulation layer 140 may include a first gate insulation layer 141 and a second gate insulation layer 142 that is provided on the first gate insulation layer 141, for example. The gate insulation layer 140 may be disposed not only in a peripheral area PA (refer to FIG. 1) of the substrate 110 but also in a display area DA (refer to FIG. 1). That is, the gate insulation layer 140 may be disposed on the entire surface of the substrate 110.

The first data pad 601 is disposed on the first gate insulation layer 141 and the second gate insulation layer 142 is disposed on the first data pad 601. The second gate insulation layer 142 covers a part of the first data pad 601, and specifically, the second gate insulation layer 142 covers an edge of the first data pad 601. That is, the edge of the first data pad 601 may be disposed between the first gate insulation layer 141 and the second gate insulation layer 142.

An interlayer insulation layer 160 may be provided on the second gate insulation layer 142. In an exemplary embodiment, the interlayer insulation layer 160 may include an inorganic insulation material such as a silicon oxide (SiOx), a silicon nitride (SiNx), a silicon oxynitride (SiON), a silicon oxyfluoride (SiOF), an aluminum oxide (AlOx), and the like, or an organic insulating material, for example, and may be provided as a single layer or a multilayer that includes at least one of these materials.

A contact hole 1161 that overlaps at least a part of the first data pad 601 is provided in the second gate insulation layer 142 and the interlayer insulation layer 160. The contact hole 1161 may overlap a center portion of the first data pad 601.

The first auxiliary data pad 671 is provided on the interlayer insulation layer 160. The first auxiliary data pad 671 is connected with the first data pad 601 through the contact hole 1161. The first auxiliary data pad 671 covers the portion of the first data pad 601, overlapping the contact hole 1161.

A circuit board 410 faces the substrate 110, and a pad portion 420 is disposed under the circuit board 410. A data driver is installed in the circuit board 410, and the pad portion 420 is connected with the data driver. The circuit board 410 and the pad portion 420 provide an IC chip (refer to FIG. 2).

An anisotropic conductive film 440 is provided between the substrate 110 and the circuit board 410. The anisotropic conductive film 440 is an adhesive film used for circuit connection, and has anisotropicity such that the anisotropic conductive film 440 is electrically conductive in one direction but is electrically insulated in the other direction. The anisotropic conductive film 440 includes an adhesive that is cured by heat and a micro-conductive particle 450 that is provided in the adhesive. When a pressure is applied to the anisotropic conductive film 440 at a high temperature, the conductivity particle 450 contacts the first auxiliary data pad 671 and the pad portion 420 of the IC chip (i.e., IC of FIG. 2), and accordingly, the first auxiliary data pad 671 and the pad portion 420 are electrically connected with each other. In addition, when the adhesive is cured, the substrate 110 and the circuit board 410 are physically connected with each other.

Referring to FIGS. 3 and 5, the second data pad 602 has a quadrangular shape in a plan view, and may substantially have a parallelogram shape, for example. Two sides of the parallelogram may be parallel with the first direction W1 and the other two sides thereof may be parallel with the second direction W2. The shape of the second data pad 602 may be similar to that of the first data pad 601. The second data pad 602 is disposed in a lower side of the first data pad 601 and may be adjacent to the first data pad 601 in the first direction W1. The second data pad 602 is connected with a second connection wire 702 and a second test wire 902. The second connection wire 702 is directly connected with the second data pad 602, and particularly, may be connected with an upper edge of the second data pad 602. The second connection wire 702 may have a plurality of bent portions, and may alternately extend in the vertical direction and the first direction W1. The second test wire 902 is directly connected with the second data pad 602, and particularly, may be connected with a lower edge of the second data pad 602. The second test wire 902 may have a plurality of bent portions, and may alternately extend in the vertical direction and the first direction W1. The second data pad 602, the second connection wire 702, and the second test wire 902 are disposed in the same layer. The second data pad 602 is disposed in a different layer from that of the first data pad 601, the first connection wire 701, and the first test wire 901.

As shown in FIG. 8, the buffer layer 120 is disposed on the substrate 110, the gate insulation layer 140 is disposed on the buffer layer 120, and the second data pad 602 is disposed on the gate insulation layer 140. The second data pad 602 is disposed on the second gate insulation layer 142.

The interlayer insulation layer 160 is disposed on the second data pad 602. The interlayer insulation layer 160 covers a part of the second data pad 602, and particularly, covers an edge of the second data pad 602. That is, the edge of the second data pad 602 may be disposed between the second gate insulation layer 142 and the interlayer insulation layer 160. A contact hole 1162 that overlaps at least a part of the second data pad 602 is provided in the interlayer insulation layer 160. The contact hole 1162 may contact a center portion of the second data pad 602.

A second auxiliary data pad 672 is disposed on the interlayer insulation layer 160. The second auxiliary data pad 672 is connected with the second data pad 602 through the contact hole 1162. The second auxiliary data pad 672 covers the portion of the second data pad 602 that is overlapped with the contact hole 1162.

Referring to FIGS. 3 and 4, the plurality of data pads 600 may include a third data pad 603 that is disposed in the leftmost side in the third row. The third data pad 603 is disposed adjacent to the second data pad 602 along the first direction W1. The third data pad 603 may be disposed in a different layer from that of the second data pad 602.

The third data pad 603 is disposed in the shape of a quadrangle in a plan view, and may be substantially provided in the shape of a parallelogram, for example. Two sides of the parallelogram may be parallel with the first direction W1 and the other two sides thereof may be parallel with the second direction W2. The shape of the third data pad 603 may be similar to that of the second data pad 602. The third data pad 603 is disposed below the second data pad 602, and may be adjacent to the second data pad 602 along the first direction W1. The third data pad 603 is connected with a third connection wire 703 and a third test wire 903. The third connection wire 703 is directly connected with the third data pad 603, and particularly may be connected with an upper edge of the third data pad 603. The third connection wire 703 may have a plurality of bent portions, and may alternately extend in the vertical direction and the first direction W1. The third test wire 903 is directly connected with the third data pad 603, and particularly, may be connected with a lower edge of the third data pad 603. The third test wire 903 may have a plurality of bent portions, and may alternately extend in the vertical direction and the first direction W. The third data pad 603, the third connection wire 703, and the third test wire 903 are disposed in the same layer. The third data pad 603 may be disposed in the same layer as the first data pad 601, the first connection wire 701, and the first test wire 901. The third data pad 603 is disposed in a different layer from that of the second data pad 602, the second connection wire 702, and the second test wire 902.

Referring to FIGS. 3 and 5, the plurality of data pads 600 may further include a fourth data pad 604 that is disposed in the leftmost side of the fourth row. The fourth data pad 604 is disposed adjacent to the third data pad 603 along the first direction W1. The fourth data pad 604 may be disposed in a different layer from that of the third data pad 603.

The fourth data pad 604 has a quadrangular shape in a plan view, and may substantially provided in the shape of a parallelogram, for example. Two sides of the parallelogram may be parallel with the first direction W1 and the other two sides thereof may be parallel with the second direction W2. The shape of the fourth data pad 604 may be similar to that of the third data pad 603. The fourth data pad 604 is disposed below the third data pad 603, and may be adjacent to the third data pad 603 along the first direction W1. The fourth data pad 604 is connected with a fourth connection wire 704 and a fourth test wire 904. The fourth connection wire 704 is directly connected with the fourth data pad 604, and particularly, may be connected with an upper edge of the fourth data pad 604. The fourth connection wire 704 may have a plurality of bent portions, and may alternately extend in the vertical direction and the first direction W1. The fourth test wire 904 is directly connected with the fourth data pad 604, and particularly, may be connected with a lower edge of the fourth data pad 604. The fourth test wire 904 may substantially extend in a vertical direction. The fourth data pad 604, the fourth connection wire 704, and the fourth test wire 904 are disposed in the same layer. The fourth data pad 604 may be disposed in the same layer as that of the second data pad 602, the second connection wire 702, and the second test wire 902. The fourth data pad 604 is disposed in a different layer from that of the first data pad 601, the first connection wire 701, the first test wire 901, the third data pad 603, the third connection wire 703, and the third test wire 903.

Referring to FIGS. 3 and 4, the plurality of data pad 600 may further include a fifth data pad 605 that is disposed in the first row. The fifth data pad 605 is disposed adjacent to the first data pad 601 along the second direction W2. The fifth data pad 605 may be disposed in the same layer as that of the first data pad 601.

The fifth data pad 605 is provided in the shape of a quadrangle in a plan view, and may be substantially provided in the shape of a parallelogram, for example. Two sides of the parallelogram may be parallel with the first direction W1 and the other two sides thereof may be parallel with the second direction W2. The shape of the fifth data pad 605 may be similar to that of the first data pad 601. The fifth data pad 605 is disposed in the right side of the first data pad 601, and may be adjacent to the first data pad 601 along the second direction W2. The fifth data pad 605 is connected with a fifth connection wire 705 and a fifth test wire 905. The fifth connection wire 705 is directly connected with the fifth data pad 605, and particularly may be connected with an upper edge of the fifth data pad 605. The fifth connection wire 705 may substantially extend in the vertical direction. The fifth test wire 905 is directly connected with the fifth data pad 605, and particularly, may be connected with a lower edge of the fifth data pad 605. The fifth test wire 905 may have a plurality of bent portions, and may alternately extend in the vertical direction and the first direction W1. The fifth data pad 605, the fifth connection wire 705, and the fifth test wire 905 may be disposed in the same layer. The fifth data pad 605 may be disposed in the same layer as that of the first data pad 601, the first connection wire 701, and the first test wire 901.

Referring to FIGS. 3 to 5, the plurality of data pads 600 may further include a sixth data pad 606 that is disposed in the second row, a seventh data pad 607 that is disposed in the third row, and an eighth data pad 608 that is disposed in the fourth row. The sixth data pad 606 is disposed adjacent to the fifth data pad 605 along the first direction W1. The seventh data pad 607 is disposed adjacent to the sixth data pad 606 along the first direction W1. The eighth data pad 608 is disposed adjacent to the seventh data pad 607 along the first direction W1.

The sixth data pad 606, the seventh data pad 607, and the eighth data pad 608 are provided in the shape of a quadrangle in a plan view, respectively, and may be similar to the fifth data pad 605 in shape, for example.

The sixth data pad 606 is directly connected with a sixth connection wire 706 and a sixth test wire 906, and is disposed in the same layer as that of the sixth connection wire 706 and the sixth test wire 906. The sixth data pad 606 is disposed in a different layer from that of the fifth data pad 605, the fifth connection wire 705, and the fifth test wire 905. The seventh data pad 607 is directly connected with a seventh connection wire 707 and a seventh test wire 907, and is disposed in the same layer as that of the seventh connection wire 707 and the seventh test wire 907. The seventh data pad 607 may be disposed in the same layer as that of the fifth data pad 605, the fifth connection wire 705, and the fifth test wire 905. The seventh data pad 607 is disposed in a different layer from that of the sixth data pad 606, the sixth connection wire 706, and the sixth test wire 906. The eighth data pad 608 is directly connected with an eighth connection wire 708 and an eighth test wire 908, and is disposed in the same layer as that of the eighth connection wire 708 and the eighth test wire 908. The eighth data pad 608 may be disposed in the same layer as that of the sixth data pad 606, the sixth connection wire 706, and the sixth test wire 906. The eighth data pad 608 is disposed in a different layer from that of the fifth data pad 605, the fifth connection wire 705, the fifth test wire 905, the seventh data pad 607, the seventh connection wire 707, and the seventh test wire 907.

The data pads 600 that are disposed in the same rows are disposed in the same layers, respectively. In an exemplary embodiment, the plurality of data pads 600 that are disposed in the first row are disposed in the same layer, for example. The plurality of data pads 600 that are disposed in the second row are disposed in the same layer. The plurality of data pads 600 that are disposed in the third row are disposed in the same layer. The plurality of data pads 600 that are disposed in the fourth row are disposed in the same layer. The connection wires 700 and the test wires 900 that are connected with the respective data pads 600 are disposed in the same layer as that of the respective data pads 600, and are directly connected therewith.

Data pads 600 that are disposed in different rows that are adjacent to each other in the first direction W1 are respectively disposed in different layers. In an exemplary embodiment, the data pad 600 disposed in the second row is disposed in a different layer from that of the data pad 600 that is disposed in the first row, for example. The data pad 600 disposed in the third row is disposed in a different layer from that of the data pad 600 that is disposed in the second row. The data pad 600 disposed in the fourth row is disposed in a different layer from that of the data pad 600 that is disposed in the third row. In this case, the data pad 600 disposed in the third row may be disposed in the same layer as that of the data pad 600 that is disposed in the first row. The data pad 600 disposed in the fourth row may be disposed in the same layer as that of the data pad 600 that is disposed in the second row. However, the invention is not limited thereto, and data pads 600 disposed in the first, second, third, and fourth rows may be respectively disposed in different layers.

Three wires 700 and 900 are disposed between data pads 600 that are disposed in the same row and adjacent to each other in the second direction W2. In an exemplary embodiment, the second connection wire 702, the third connection wire 703, and the fourth connection wire 704 are disposed between the first data pad 601 and the fifth data pad 605, for example. The third connection wire 703, the fourth connection wire 704, and the fifth test wire 905 are disposed between the second data pad 602 and the sixth data pad 606. The fourth connection wire 704, the fifth test wire 905, and the sixth test wire 906 are disposed between the third data pad 603 and the seventh data pad 607. The fifth test wire 905, the sixth test wire 906, and the seventh test wire 907 are disposed between the fourth data pad 604 and the eighth data pad 608.

The first data pad 601 and the second connection wire 702 are adjacent to each other, and the first data pad 601 and the second connection wire 702 may be applied with different voltages. Thus, a design that can prevent the first data pad 601 and the second connection wire 702 from being short-circuited is needed. When the first data pad 601 and the second connection wire 702 are disposed in the same layer, the first data pad 601 and the second connection wire 702 may be short-circuited. In order to prevent the short-circuit between the first data pad 601 and the second connection wire 702, the first data pad 601 and the second connection wire 702 need to be disposed apart from each other with a wide gap. In the illustrated exemplary embodiment, the first data pad 601 and the second connection wire 702 are respectively disposed in different layers, and therefore the first data pad 601 and the second connection wire 702 are not short-circuited even though the gap between the first data pad 601 and the second connection wire 702 is reduced.

The second connection wire 702 and the third connection wire 703 are adjacent to each other, and may be respectively applied with different voltages. Thus, a design that can prevent the second connection wire 702 and the third connection wire 703 from being short-circuited is needed. When the second connection wire 702 and the third connection wire 703 are disposed in the same layer, the second connection wire 702 and the third connection wire 703 may be short-circuited. In order to prevent the short-circuit, the second connection wire 702 and the third connection wire 703 are disposed apart from each other with a wide gap. In the illustrated exemplary embodiment, the second connection wire 702 and the third connection wire 703 are respectively disposed in different layers, and accordingly the second connection wire 702 and the third connection wire 703 are not short-circuited even though the gap between the second connection wire 702 and the third connection wire 703 is reduced.

The third connection wire 703 and the fourth connection wire 704 are disposed adjacent to each other, and may be respectively applied with different voltages. Thus, a design that can prevent the third connection wire 703 and the fourth connection wire 704 from be short-circuited is needed. When the third connection wire 703 and the fourth connection wire 704 are disposed in the same layer, the third connection wire 703 and the fourth connection wire 704 may be short-circuited. In order to prevent the short-circuit, the third connection wire 703 and the fourth connection wire 704 are disposed apart from each other with a wide gap. In the illustrated exemplary embodiment, the third connection wire 703 and the fourth connection wire 704 are respectively disposed in different layers, and the third connection wire 703 and the fourth connection wire 704 are not short-circuited even though the gap therebetween is reduced.

The fourth connection wire 704 and the fifth data pad 605 are adjacent to each other, and the fourth connection wire 704 and the fifth data pad 605 may be applied with different voltages. Accordingly, a design that can prevent the fourth connection wire 704 and the fifth data pad 605 from be short-circuited is needed. When the fourth connection wire 704 and the fifth data pad 605 are disposed in the same layer, the fourth connection wire 704 and the fifth data pad 605 may be short-circuited. In order to prevent the short-circuit, the fourth connection wire 704 and the fifth data pad 605 are disposed apart from each other with a wide gap. In the illustrated exemplary embodiment, the fourth connection wire 704 and the fifth data pad 605 are respectively disposed in different layers, and therefore the fourth connection wire 704 and the fifth data pad 605 are not short-circuited even though a distance therebetween is reduced.

As described, in the illustrated exemplary embodiment, the data pads 600 and the wires 700 and 900 that are adjacent to each other are respectively disposed in different layers, and accordingly, distances between adjacent data pads 600 and the wires 700 and 900 can be reduced. A distance between the wires 700 and 900 may be reduced, and a distance between data pads 600 that are adjacent to each other in the second direction W2 may be reduced. Accordingly, the area of the pad area AA can be reduced.

Hereinabove, the data pad has been described, but the invention is not limited thereto. A similar structure may be applied to a gate pad as well.

Next, a display area of a display device according to an exemplary embodiment will be described in detail with reference to FIGS. 10 to 14.

Figure 10:
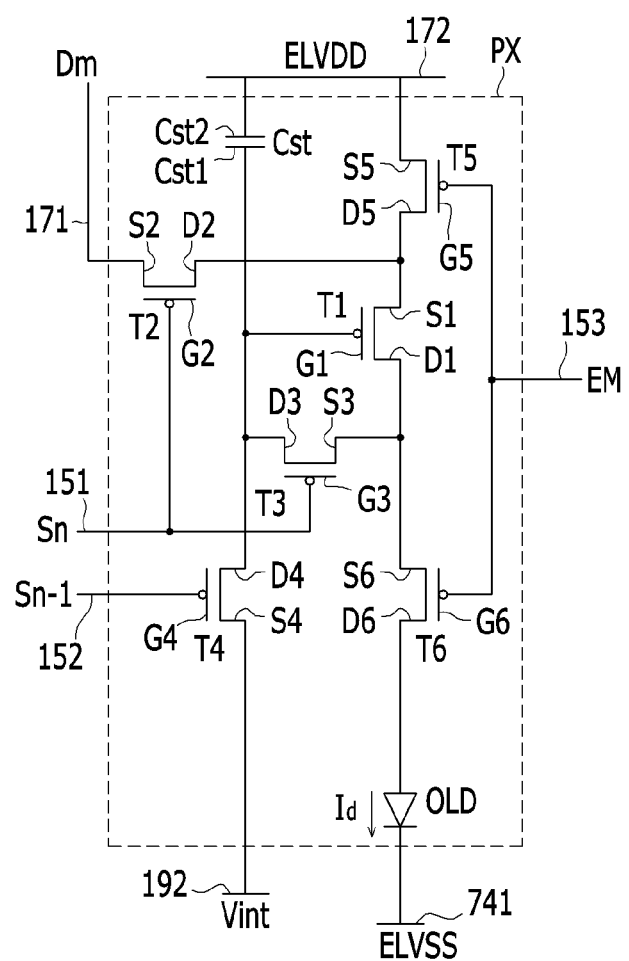
FIG. 10 is an equivalent circuit of the exemplary embodiment of one pixel of the display device.

FIG. 10 is an equivalent circuit view of one pixel of a display device according to an exemplary embodiment.

As shown in FIG. 10, a display device according to the illustrated exemplary embodiment includes a plurality of signal lines 151, 152, 153, 171, 172, and 192 and a plurality of pixels PX that are connected with the plurality of signal lines and substantially arranged in a matrix format.

The respective pixels PX include a plurality of transistors T1, T2, T3, T4, T5, and T6 that are connected with the plurality of signal lines 151, 152, 153, 171, 172, and 192, a storage capacitor Cst, and an OLED OLD.

The transistors T1, T2, T3, T4, T5, and T6 include a driving transistor T1, a switching transistor T2, a compensation transistor T3, an initialization transistor T4, an operation control transistor T5, and a light emission control transistor T6. The signal lines 151, 152, 153, 171, 172, and 192 include a scan line 151 that transmits a scan signal Sn, a previous scan line 152 that transmits a previous scan signal Sn-1 to the initialization transistor T4, a light emission control line 153 that transmits a light emission control signal EM to the operation control transistor T5 and the light emission control transistor T6, a data line 171 that transmits a data signal Dm while crossing the scan line 151, a driving voltage line 172 that transmits a driving voltage ELVDD and is provided substantially parallel with the data line 171, and an initialization voltage line 192 that transmits an initialization voltage Vint for initialization of the driving transistor T1.

A gate electrode G1 of the driving transistor T1 is connected with a first end Cst1 of the storage capacitor Cst, a source electrode S1 of the driving transistor T1 is connected with the driving voltage line 172 via the operation control transistor T5, and a drain electrode D1 of the driving transistor T1 is electrically connected with an anode of the OLED OLD via the light emission control transistor T6. The driving transistor T1 receives the data signal Dm according to a switching operation of the switching transistor T2, and supplies a driving current Id to the OLED OLD.

A gate electrode G2 of the switching transistor T2 is connected with the scan line 151, a source electrode S2 of the switching transistor T2 is connected with the data line 171, and a drain electrode D2 of the switching transistor T2 is connected with the driving voltage line 172 via the operation control transistor T5 while being connected with the source electrode S1 of the driving transistor T1. The switching transistor T2 is turned on according to the scan signal Sn received through the scan line 151, and performs a switching operation to transmit the data signal Dm transmitted to the data line 171 to the source electrode S1 of the driving transistor T1.

A gate electrode G3 of the compensation transistor T3 is connected with the scan line 151, a source electrode S3 of the compensation transistor T3 is connected with the anode of the OLED OLD via the light emission control transistor T6 while being connected with the drain electrode D1 of the driving transistor T1, and a drain electrode D3 of the compensation transistor T3 is connected with a drain electrode D4 of the initialization transistor T4, the first end Cst1 of the capacitor Cst, and the gate electrode G1 of the driving transistor T1. The compensation transistor T3 is turned on according to the scan signal Sn received through the scan line 151, and diode-connects the driving transistor T1 by connecting the gate electrode G1 and the drain electrode D1 of the driving transistor T1 to each other.

A gate electrode G4 of the initialization transistor T4 is connected with the previous scan line 152, a source electrode S4 of the initialization transistor T4 is connected with the initialization voltage line 192, and a drain electrode D4 of the initialization transistor T4 is connected with the first end Cst1 of the capacitor Cst and the gate electrode G1 of the driving transistor T1 through the drain electrode D3 of the compensation transistor T3. The initialization transistor T4 is turned on according to the previous scan signal Sn-1 received through the previous scan line 152, and performs an initialization operation to initialize a gate voltage of the gate electrode G1 of the driving transistor T1 by transmitting the initialization voltage Vint to the gate electrode G1 of the driving transistor T1.

A gate electrode G5 of the operation control transistor T5 is connected with the light emission control line 153, a source electrode S5 of the operation control transistor T5 is connected with the driving voltage line 172, and a drain electrode D5 of the operation control transistor T5 is connected with the source electrode S1 of the driving transistor T1 and the drain electrode D2 of the switching transistor T2.

A gate electrode G6 of the light emission control transistor T6 is connected with the light emission control line 153, a source electrode S6 of the light emission control transistor T6 is connected with the drain electrode D1 of the driving transistor T1 and the source electrode S3 of the compensation transistor T3, and a drain electrode D6 of the light emission control transistor T6 is electrically connected with the anode of the OLED OLD. The operation control transistor T5 and the light emission control transistor T6 are simultaneously turned on according to the light emission control signal EM received through the light emission control line 153 such that the driving voltage ELVDD is compensated by the diode-connected driving transistor T1 and then connected to the OLED OLD.

A second end Cst2 of the storage capacitor Cst is connected with the driving voltage line 172, and a cathode of the OLED OLD is connected with a common voltage line 741 that transmits a common voltage ELVSS.

A detailed structure of the display device according to the exemplary embodiment of FIG. 10 will now be described with reference to FIGS. 11, 12, 13, and 14, together with FIG. 10.

Figure 11:
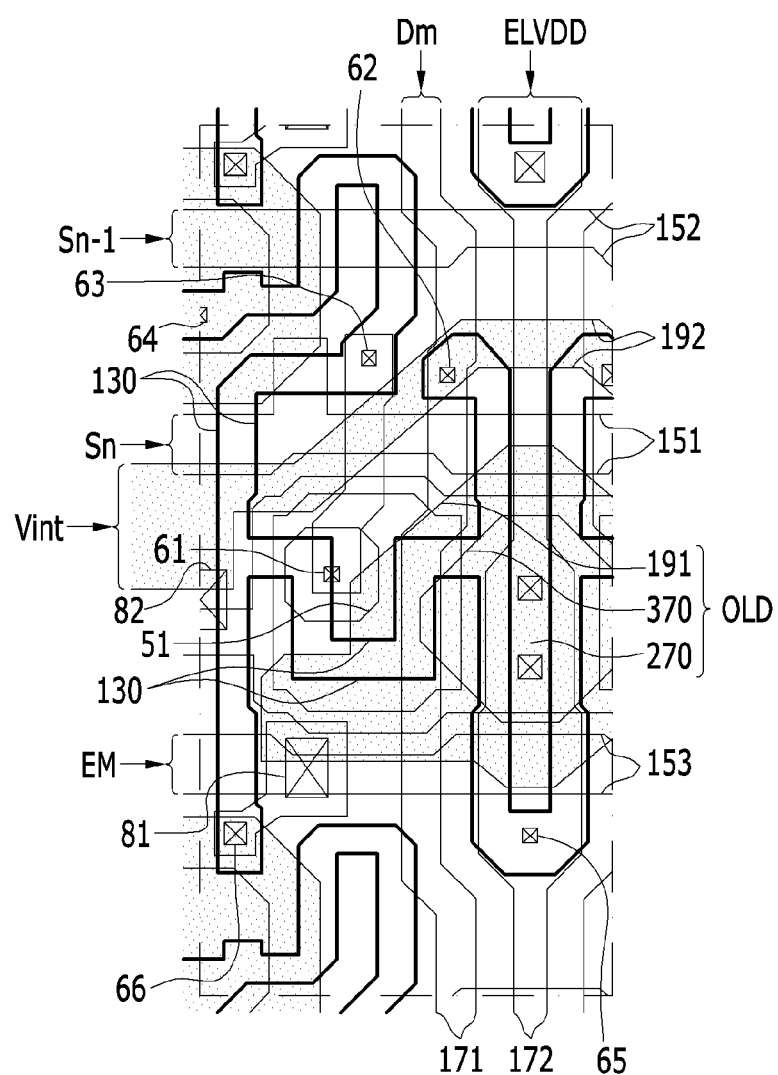
FIG. 11 is a schematic plan view of the exemplary embodiment of a plurality of transistors and a capacitor of the display device.
Figure 12:
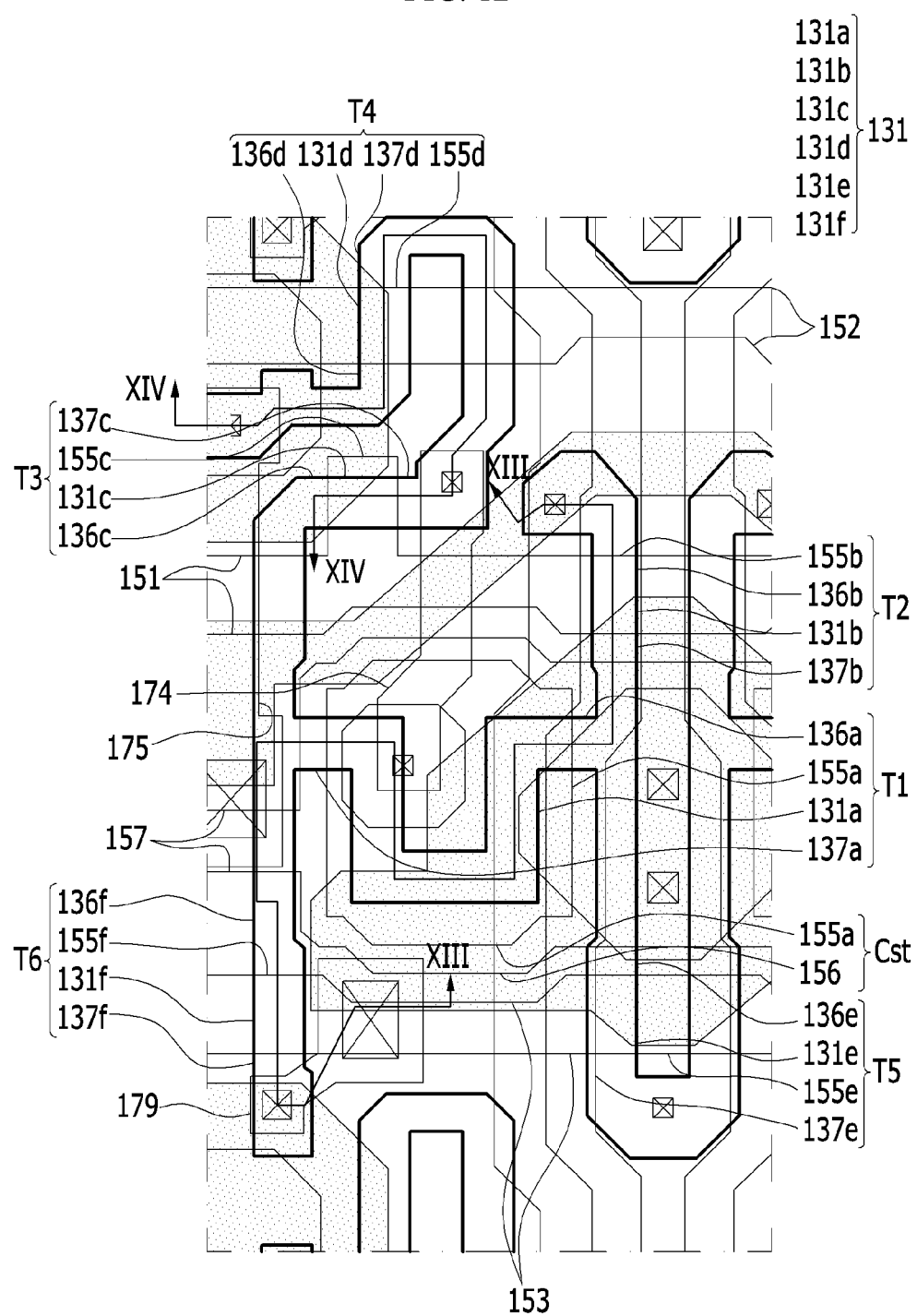
FIG. 12 is a detailed plan view of FIG. 11.
Figure 13:
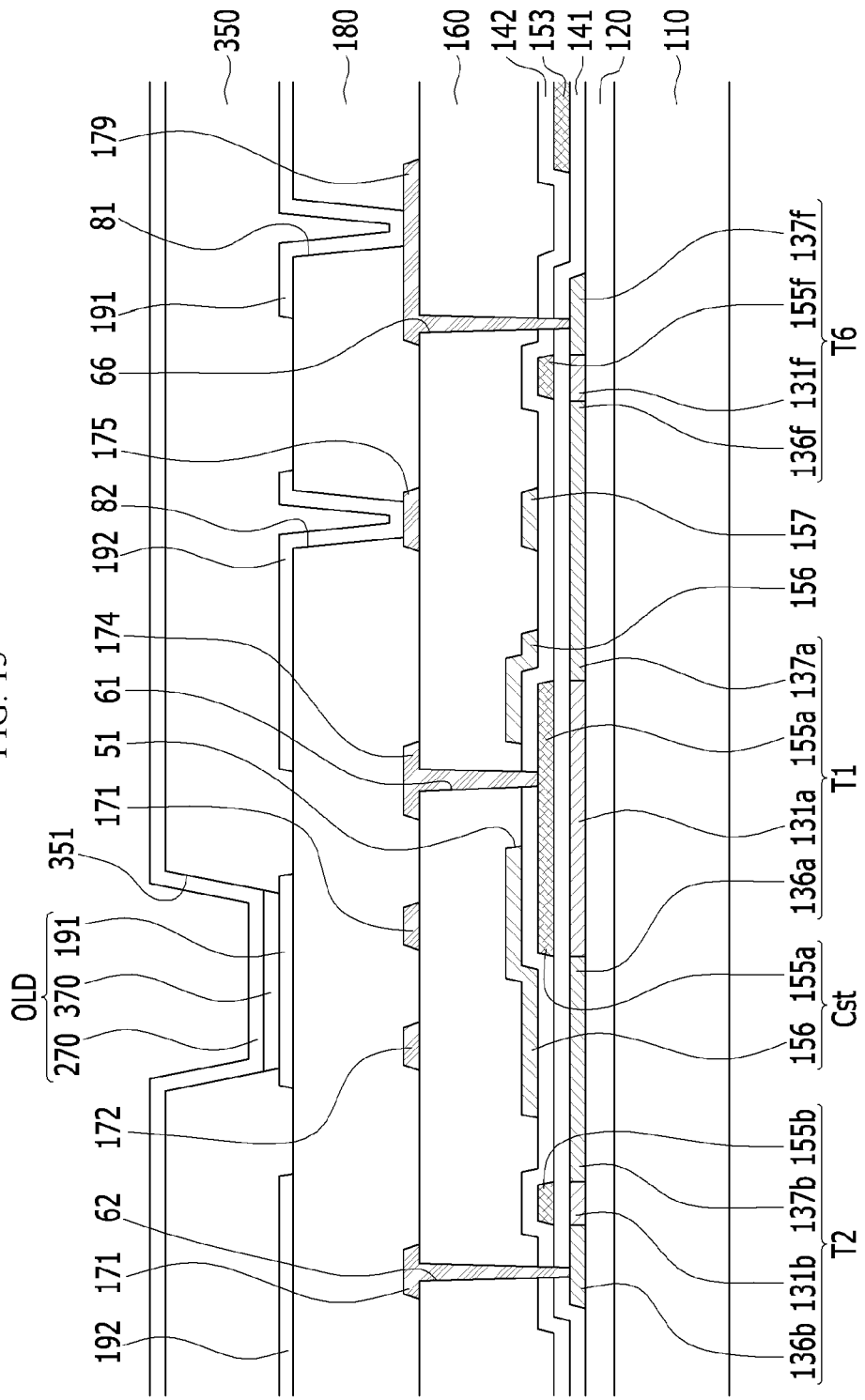
FIG. 13 is a cross-sectional view of FIG. 12, taken along line XIII-XIII.
Figure 14:
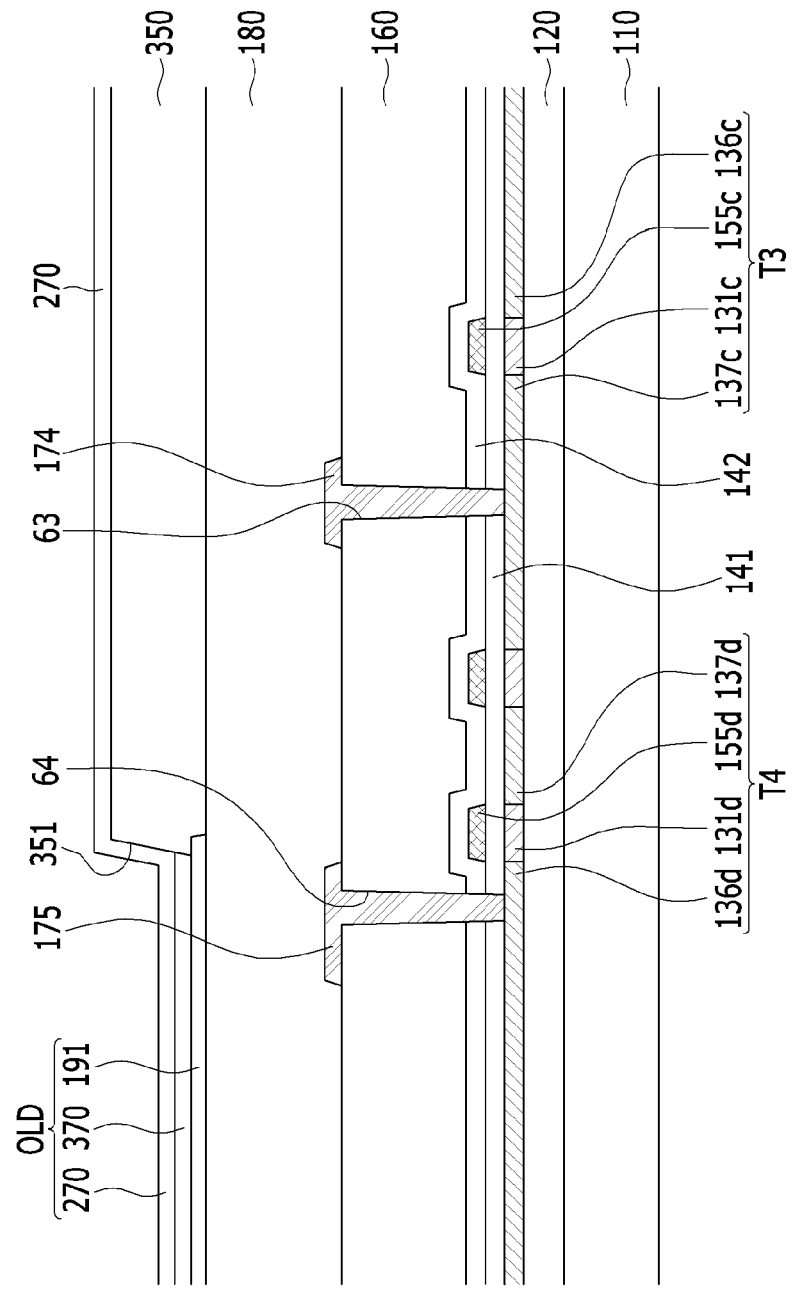
FIG. 14 is a cross-sectional view of FIG. 12, taken along line XIV-XIV.

FIG. 11 is a schematic plan view of the plurality of transistors and the capacitor of the display device according to the exemplary embodiment, FIG. 12 is a detailed plan view of FIG. 11, FIG. 13 is a cross-sectional view of FIG. 12, taken along line XIII-XIII, and FIG. 14 is a cross-sectional view of FIG. 12, taken along line XIV-XIV.

Hereinafter, a detailed planar structure of the display device according to the exemplary embodiment will be described with reference to FIG. 11, and then the detailed planar structure will be further described with reference to FIGS. 13 and 14.

The display device according to the exemplary embodiment includes the scan line 151, the previous scan line 152, and the light emission control line 153 that respectively apply the scan signal Sn, the previous scan signal Sn-1, and the light emission control signal EM and are disposed along a row direction. In addition, the display device includes the data line 171 and the driving voltage line 172 that cross the scan line 151, the previous scan line 152, and the light emission control line 153 and apply the data signal Dm and the driving voltage ELVDD, respectively. The initialization voltage Vint is transmitted to the compensation transistor T3 from the initialization voltage line 192 via the initialization transistor T4. The initialization voltage line 192 includes straight lines and oblique lines that are alternately provided.

In addition, each pixel PX includes the driving transistor T1, the switching transistor T2, the compensation transistor T3, the initialization transistors T4, the operation control transistor T5, the light emission control transistor T6, the storage capacitor Cst, and the OLED OLD.

The OLED OLD includes a pixel electrode 191, an organic emission layer 370, and a common electrode 270.

Channels of the driving transistor T1, the switching transistor T2, the compensation transistor T3, the initialization transistor T4, the operation control transistor T5, and the light emission control transistor T6 are respectively provided in one connected semiconductor layer 130, and the semiconductor layer 130 may be bent in various shapes. In an exemplary embodiment, the semiconductor layer 130 may include a polysilicon or an oxide semiconductor, for example.

A channel 131 includes a driving channel 131a provided in the driving transistor T1, a switching channel 131b provided in the switching transistor T2, a compensation channel 131c provided in the compensation transistor T3, an initialization channel 131d provided in the initialization transistor T4, an operation control channel 131e provided in the operation control transistor T5, and a light emission control channel 131f provided in the light emission control channel 131f.

The driving transistor T1 includes the driving channel 131a, a driving gate electrode 155a, a driving source electrode 136a, and a driving drain electrode 137a. The driving gate electrode 155a overlaps the driving channel 131a, and the driving source electrode 136a and the driving drain electrode 137a are adjacent to opposite sides of the driving channel 131a. The driving gate electrode 155a is connected with a first data connection member 174 through a contact hole 61.

The switching transistor T2 includes the switching channel 131b, a switching gate electrode 155b, a switching source electrode 136b, and a switching drain electrode 137b. The switching gate electrode 155b that is a part of the scan line 151, expanding downward, overlaps the switching channel 131b, and the switching source electrode 136b and the switching drain electrode 137b are adjacent to opposite sides of the switching channel 131b. The switching source electrode 136b is connected with the data line 171 through a contact hole 62.

The compensation transistor T3 includes the compensation channel 131c, a compensation gate electrode 155c, a compensation source electrode 136c, and a compensation drain electrode 137c. The compensation gate electrode 155c that is a part of the scan line 151 overlaps the compensation channel 131c. The compensation source electrode 136c and the compensation drain electrode 137c are adjacent to opposite sides of the compensation channel 131c. The compensation drain electrode 137c is connected with the first data connection member 174 through a contact hole 63.

The initialization transistor T4 includes the initialization channel 131d, an initialization gate electrode 155d, an initialization source electrode 136d, and an initialization drain electrode 137d. In order to prevent a leakage current, two initialization gate electrodes 155d, each a part of the previous scan line 152, are provided, and the two initialization gate electrodes 155d overlap the initialization channel 131d. The initialization source electrode 136d and the initialization drain electrode 137d are adjacent to opposite sides of the initialization channel 131d. The initialization source electrode 136d is connected with a second data connection member 175 through a contact hole 64.

The operation control transistor T5 includes the operation control channel 131e, an operation control gate electrode 155e, an operation control source electrode 136e, and an operation control drain electrode 137e. The operation control gate electrode 155e that is a part of the light emission control line 153 overlaps the operation control channel 131e, and the operation control source electrode 136e and the operation control drain electrode 137e are adjacent to opposite sides of the operation control channel 131e. The operation control source electrode 136e is connected with a part expanded from the driving voltage line 172 through a contact hole 65.

The light emission control transistor T6 includes the light emission control channel 131f, a light emission control gate electrode 155f, a light emission control source electrode 136f, and a light emission control drain electrode 137f. The light emission control gate electrode 155f that is a part of the light emission control line 153 overlaps the light emission control channel 131f, and the light emission control source electrode 136f and the light emission control drain electrode 137f are adjacent to opposite sides of the light emission control channel 131f. The light emission control drain electrode 137f is connected with a third data connection member 179 through a contact hole 66.

A first end of the driving channel 131a of the driving transistor T1 is connected with the switching drain electrode 137b and the operation control drain electrode 137e, and a second end of the driving channel 131a is connected with the compensation source electrode 136c and the light emission control source electrode 136f.

The storage capacitor Cst includes a first storage electrode 155a and a second storage electrode 156 that are disposed interposing the second gate insulation layer 142 therebetween. The first storage electrode 155a corresponds to the driving gate electrode 155a, and the second storage electrode 156 is a portion expanded from a storage line 157 and fully covers the driving gate electrode 155a while occupying a wider area than the driving gate electrode 155a.

The second gate insulation layer 142 may be a dielectric material, and storage capacitance is determined by charges charged in the storage capacitor Cst and a voltage between the two storage electrodes 155a and 156. As described, since the driving gate electrode 155a is used as the first storage electrode 155a, a space for providing the storage capacity in a space that is narrowed due to the driving channel 131a that occupies a wide area in the pixel can be assured.

The first storage electrode 155a, which is the driving gate electrode 155a, is connected with a first end of the first data connection member 174 through the contact hole 61 and a storage opening 51. The storage opening 51 is an opening defined in the second storage electrode 156. Thus, the contact hole 61 through which the first end of the first data connection member 174 and the driving gate electrode 155a connect with each other is defined in the storage opening 51. The first data connection member 174 is provided in the same layer as that of the data line 171 so as to be substantially parallel with the data line 171, and a second end of the first data connection member 174 is connected with the compensation drain electrode 137c of the compensation transistor T3 and the initialization drain electrode 137d of the initialization transistor T4 through the contact hole 63. Thus, the first data connection member 174 connects the driving gate electrode 155a with the compensation drain electrode 137c of the compensation transistor T3 and the initialization drain electrode 137d of the initialization transistor T4.

Therefore, the storage capacitor Cst stores storage capacitance that corresponds to a difference between the driving voltage ELVDD transmitted to the second storage electrode 156 through the driving voltage line 172 and a driving gate voltage of the driving gate electrode 155a.

The third data connection member 179 is connected with the pixel electrode 191 through a contact hole 81, and the second data connection member 175 is connected with the initialization voltage line 192 through a contact hole 82.

Hereinafter, a cross-sectional structure of the display device according to the illustrated exemplary embodiment will be described in detail according to the stacking order.

A buffer layer 120 is provided on a substrate 110.

The semiconductor layer 130 that includes the channel 131 including the driving source electrode 136a, the switching channel 131b, the compensation channel 131c, the initialization channel 131d, the operation control channel 131e, and the light emission control channel 131f is provided on the buffer layer 120. In the semiconductor layer 130, the driving source electrode 136a and the driving drain electrode 137a are disposed at opposite sides of the driving channel 131a, and the switching source electrode 136b and the switching drain electrode 137b are disposed at opposite sides of the switching channel 131b. In addition, the compensation source electrode 136c and the compensation drain electrode 137c are disposed at opposite sides of the compensation channel 131c, and the initialization source electrode 136d and the initialization drain electrode 137d are disposed at opposite sides of the initialization channel 131d. Further, the operation control source electrode 136e and the operation control drain electrode 137e are disposed at opposite sides of the operation control channel 131e, and the light emission control source electrode 136f and the light emission control drain electrode 137f are disposed at opposite sides of the light emission control channel 131f.

The first gate insulation layer 141 that covers the semiconductor layer 130 is provided on the semiconductor layer 130. First gate wires 151, 152, 153, 155a, 155b, 155c, 155d, 155e, and 155f that include the scan line 151 including the switching gate electrode 155b and the compensation gate electrode 155c, the previous scan line 152 including the initialization gate electrode 155d, the light emission control line 153 including the operation control gate electrode 155e and the light emission control gate electrode 155f, and the driving gate electrode (i.e., the first storage electrode) 155a are disposed on the first gate insulation layer 141.

The first data pad 601 (refer to FIG. 3), the third data pad 603, the fifth data pad 605, and the seventh data pad 607 that are disposed in the above-described pad area IC of FIG. 1 may be disposed in the same layer as that of the first gate wires 151, 152, 153, 155a, 155b, 155c, 155d, 155e, and 155f. In addition, the first data pad 601, the third data pad 603, the fifth data pad 605, and the seventh data pad 607 may include the same material as that of the first gate wires 151, 152, 153, 155a, 155b, 155c, 155d, 155e, and 155f. A metallic material is deposited on the first gate insulation layer 141 and then patterned such that the first gate wires 151, 152, 153, 155a, 155b, 155c, 155d, 155e, and 155f, the first data pad 601 of FIG. 3, the third data pad 603 of FIG. 3, the fifth data pad 605 of FIG. 3, and the seventh data pad 607 of FIG. 3 can be simultaneously provided.

The second gate insulation layer 142 is disposed on the first gate wires 151, 152, 153, 155a, 155b, 155c, 155d, 155e, and 155f and the first gate insulation layer 141 to cover the same. The first gate wires 151, 152, 153, 155a, 155b, 155c, 155d, 155e, and 155f are disposed between the first gate insulation layer 141 and the second gate insulation layer 142.

Second gate wires 157 and 156 that include the storage line 157 that is disposed in parallel with the scan line 151 and the second storage electrode 156 that is a portion expanded from the storage line 156 are disposed on the second gate insulation layer 142.

The second data pad 602 of FIG. 3, the fourth data pad 604 of FIG. 3, the sixth data pad 606 of FIG. 3, and the eighth data pad 608 of FIG. 3 that are disposed in the above-described pad area IC of FIG. 1 may be disposed in the same layer as that of the second gate wires 157 and 156. In addition, the second data pad 602, the fourth data pad 604, the sixth data pad 606, and the eighth data pad 608 may include the same material as that of the second gate wires 157 and 156. A metallic material is deposited on the second gate insulation layer 142 and then patterned such that the second gate wires 157 and 156, the second data pad 602, the fourth data pad 604, the sixth data pad 606, and the eighth data pad 608 can be simultaneously provided.

An interlayer insulation layer 160 is provided on the second gate insulation layer 142 and the second gate wires 157 and 156.

The contact holes 61, 62, 63, 64, 65, and 66 that expose at least a part of an upper surface of the semiconductor layer 130 are defined in the interlayer insulation layer 160.

Data wires 171, 172, 174, 175, and 179 that include the data line 171, the driving voltage line 172, the first data connection member 174, the second data connection member 175, and the third data connection member 179 are disposed on the interlayer insulation layer 160.

The first auxiliary data pad 671 and the second auxiliary data pad 672 (refer to FIG. 3) that are disposed in the above-described pad area IC of FIG. 1 may be disposed in the same layer as that of the data wires 171, 172, 174, 175, and 179. In addition, the first auxiliary data pad 671 and the second auxiliary data pad 672 may include the same material as that of the data wires 171, 172, 174, 175, and 179. A metallic material is deposited on the interlayer insulation layer 160 and then patterned such that the data wires 171, 172, 174, 175, and 179, the first auxiliary data pad 671, and the second auxiliary data pad 672 can be simultaneously provided.

The data line 171 is connected with the switching source electrode 136b through the contact hole 62. A first end of the first data connection member 174 is connected with the first storage electrode 155a through the contact hole 61, and a second end of the first data connection member 174 is connected with the compensation drain electrode 137c and the initialization drain electrode 137d through the contact hole 63. The second data connection member 175 that extends in parallel with the data line 171 is connected with the initialization source electrode 136d through the contact hole 64. The third data connection member 179 is connected with the light emission control drain electrode 137f through the contact hole 66.

A passivation layer 180 is disposed on the data wires 171, 172, 174, 175, and 179 and the interlayer insulation layer 160 to cover the same.

The pixel electrode 191 and the initialization voltage line 192 are disposed on the passivation layer 180. The third data connection member 179 is connected with the pixel electrode 191 through a contact hole 81 defined in the passivation layer 180, and the second data connection member 175 is connected with the initialization voltage line 192 through a contact hole 82 defined in the passivation layer 180.

A pixel defining layer 350 that covers the passivation layer 180, the initialization voltage line 192, and an edge of the pixel electrode 191 is provided on the passivation layer 180, the initialization voltage line 192, and the edge of the pixel electrode 191, and a pixel opening 351 that exposes the pixel electrode 191 is defined in the pixel defining layer 350.

An organic emission layer 370 is disposed on the pixel electrode 191 that is exposed by the pixel opening 351, and a common electrode 270 is provided on the organic emission layer 370. The common electrode 270 is disposed on the pixel defining layer 350 and thus disposed over the plurality of pixels PX (refer to FIGS. 1 and 10). As described, the OLED OLD that includes the pixel electrode 191, the organic emission layer 370, and the common electrode 270 is provided.

Next, a display device according to another exemplary embodiment will be described with reference to FIG. 15.

Figure 15:
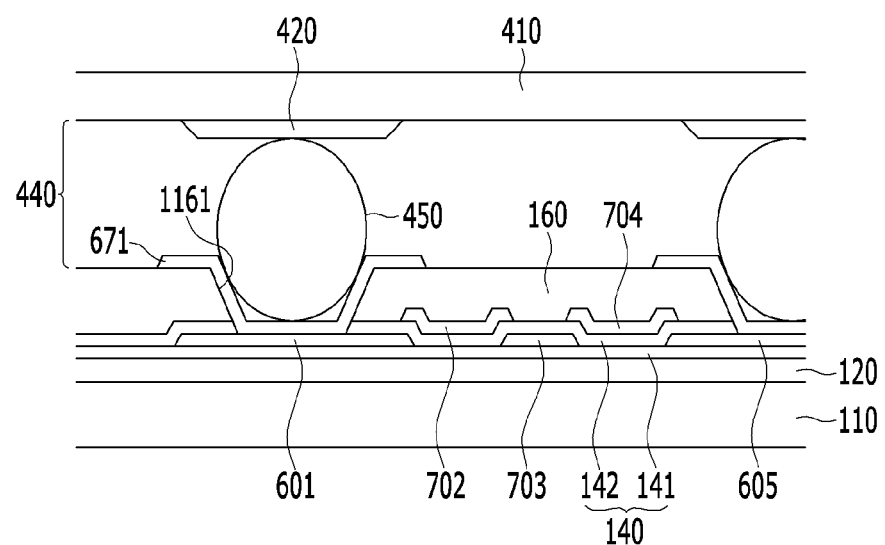
FIG. 15 is a cross-sectional view of an exemplary embodiment of a display device.

A display device according to an exemplary embodiment of FIG. 15 is substantially the same as the display device according to the exemplary embodiment of FIGS. 1 to 14, and therefore no duplicated description will be provided. The exemplary embodiment of FIG. 15 is different from the above-exemplary embodiment of FIGS. 1 to 14 in that a data pad and a connection wire overlap each other or adjacent connection wires overlap each other, and this will be described in further detail.

FIG. 15 is a cross-sectional view of a display device according to an exemplary embodiment.

As shown in FIG. 15, a second connection wire 702, a third connection wire 703, and a fourth connection wire 704 are provided between a first data pad 601 and a fifth data pad 605.

In the above described exemplary embodiment of FIG. 9, the first data pad 601 and the second connection wire 702 that are adjacent each other do not overlap each other, and the second connection wire 702 and the third connection wire 703 that are adjacent to each other do not overlap each other. Further, the adjacent third and fourth connection wires 703 and 704 do not overlap each other, and the fourth connection wire 704 and the fifth data pad 605 that are adjacent to each other do not overlap each other.

However, in the illustrated exemplary embodiment of FIG. 15, the first data pad 601 and the second connection wire 702 that are adjacent to each other may overlap each other. The second connection wire 702 and the third connection wire 703 that are adjacent to each other may overlap each other. The third connection wire 703 and the fourth connection wire 704 that are adjacent to each other may overlap each other. The fourth connection wire 704 and the fifth data pad 605 that are adjacent each other may overlap each other. In the illustrated exemplary embodiment, a data pad and a connection wire 700 that are adjacent to each other may be overlapped with each other because they have no possibility of being short-circuited. Further, adjacent connection wires 700 have no possibility of being short-circuited because adjacent connection wires 700 are respectively disposed in different layers, and accordingly, may be overlapped with each other.

Next, a display device according to an exemplary embodiment will be described with reference to FIGS. 16 and 17.

Figure 16:
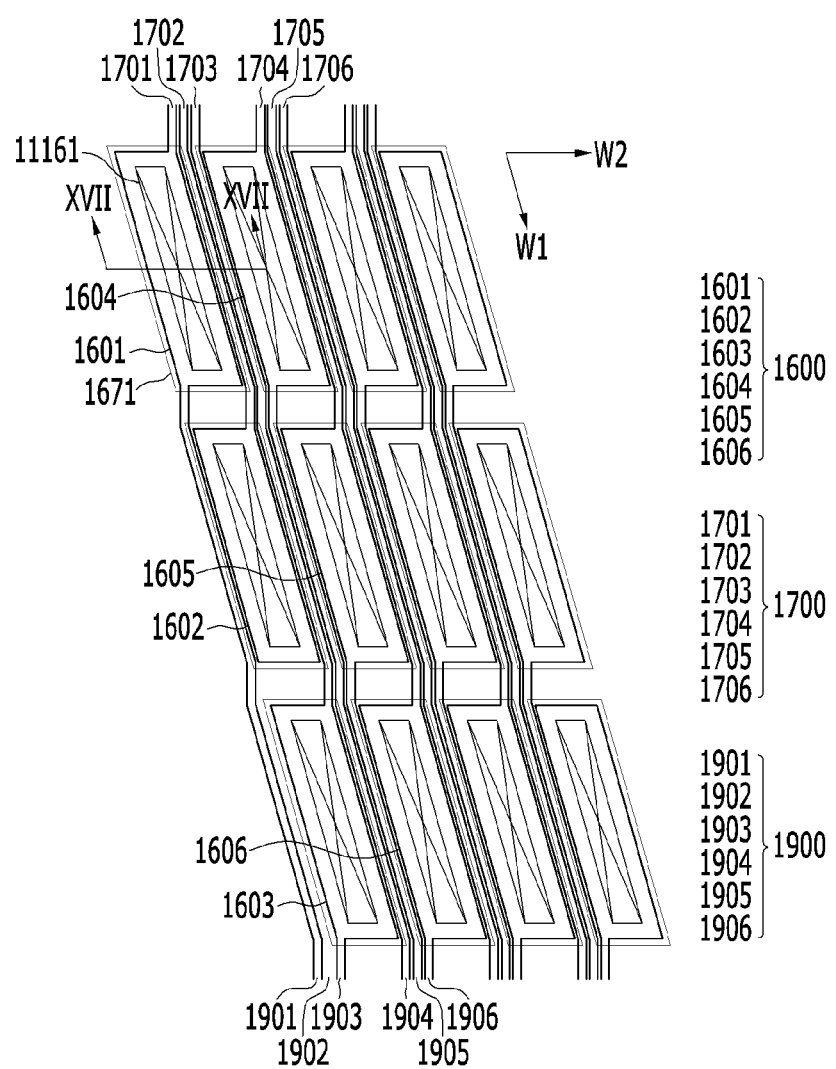
FIG. 16 is a top plan view that illustrates an exemplary embodiment of a part of a pad area of a display device.
Figure 17:
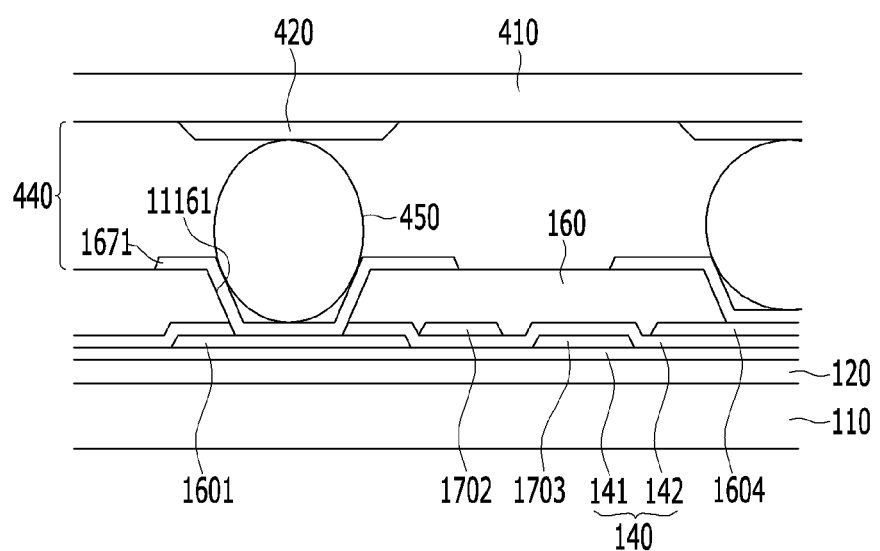
FIG. 17 is a cross-sectional view of FIG. 16, taken along line XVII-XVII.

A display device according to an exemplary embodiment of FIGS. 16 and 17 is substantially the same as the display device according to the exemplary embodiment of FIGS. 1 to 14, and therefore no duplicated description will be provided. The illustrated exemplary embodiment of FIGS. 16 and 17 is different from the exemplary embodiment of FIGS. 1 to 14 in that a plurality data pads are arranged in three rows, and this will be described in detail.

FIG. 16 is a top plan view that partially illustrates a pad area of a display device according to an exemplary embodiment, and FIG. 17 is a cross-sectional view of FIG. 16, taken along line XVII-XVII.

As shown in FIGS. 16 and 17, a plurality of data pads 1600 may be aligned along a first direction W1 and a second direction W2 in the pad area of the display device. In this case, the plurality of data pads 1600 may be aligned in three rows.

The plurality of data pads 1600 include a first data pad 1601 and a fourth data pad 1604 that are disposed in the first row, a second data pad 1602 and a fifth data pad 1605 that are disposed in the second row, and a third data pad 1603 and a sixth data pad 1606 that are disposed in the third row.

The first data pad 1601 and the second data pad 1602 are disposed adjacent to each other along the first direction W1, and they are respectively disposed in different layers. The second data pad 1602 and the third data pad 1603 are disposed adjacent to each other along the first direction W1, and they are respectively disposed in different layers. The third data pad 1603 may be disposed in the same layer as that of first data pad 1601. The first data pad 1601 is connected with a first connection wire 1701 and a first test wire 1901, and they are disposed in the same layer. The second data pad 1602 is connected with a second connection wire 1702 and a second test wire 1902, and they are disposed in the same layer. The third data pad 1603 is connected with a third connection wire 1703 and a third test wire 1903, and they are disposed in the same layer.

The first data pad 1601 and the fourth data pad 1604 are disposed adjacent to each other along the second direction W2, and they are disposed in the same layer. The fourth data pad 1604 and the fifth data pad 1605 are disposed adjacent to each other, and they are respectively disposed in different layers. The fifth data pad 1605 and the sixth data pad 1606 are disposed adjacent to each other along the first direction W1, and they are respectively disposed in different layers. The sixth data pad 1606 and the fourth data pad 1604 may be disposed in the same layer. The fourth data pad 1604 is connected with a fourth connection wire 1704 and a fourth test wire 1904, and they are disposed in the same layer. The fifth data pad 1605 is connected with a fifth connection wire 1705 and a fifth test wire 1905, and they are disposed in the same layer. The sixth data pad 1606 is connected with a sixth connection wire 1706 and a sixth test wire 1906, and they are disposed in the same layer.

Two wires 1700 and 1900 are disposed between the pads 1600 that are disposed adjacent to each other in the second direction W2 in the same row. In an exemplary embodiment, the second connection wire 1702 and the third connection wire 1703 are disposed between the first data pad 1601 and the fourth data pad 1604, for example. The third connection wire 1703 and the fourth test wire 1904 are disposed between the second data pad 1602 and the fifth data pad 1605. The fourth test wire 1904 and the fifth test wire 1905 are disposed between the third data pad 1603 and the sixth data pad 1606.

Since the first data pad 1601 and the second connection wire 1702 are respectively disposed in different layers, the first data pad 1601 and the second connection wire 1702 are not short-circuited even though a distance therebetween is reduced. Since the second connection wire 1702 and the third connection wire 1703 are respectively disposed in different layers, the second connection wire 1702 and the third connection wire 1703 are not short-circuited even though a distance therebetween is reduced. Since the third connection wire 1703 and the fourth data pad 1604 are respectively disposed in different layers, the third connection wire 1703 and the fourth data pad 1604 are not short-circuited even though a distance therebetween is reduced.

A second gate insulation layer 142 and an interlayer insulation layer 160 are provided on the first data pad 1601. A contact hole 11161 that overlaps at least a part of the first data pad 1601 is provided in the second gate insulation layer 142 and the interlayer insulation layer 160. The contact hole 11161 may overlap a center portion of the first data pad 1601. A first auxiliary data pad 1671 is provided on the interlayer insulation layer 160. The first auxiliary data pad 1671 is connected with the first data pad 1601 through the contact hole 11161. The first auxiliary data pad 1671 covers a portion of the first data pad 1601 through the contact hole 11161.

It is illustrated that the first auxiliary data pad 1671 overlaps the second connection wire 1702. However, the invention is not limited thereto, and the first auxiliary data pad 1671 may not overlap the second connection wire 1702.

Next, a display device according to an exemplary embodiment of FIGS. 18 and 19 will be described.

Figure 18:
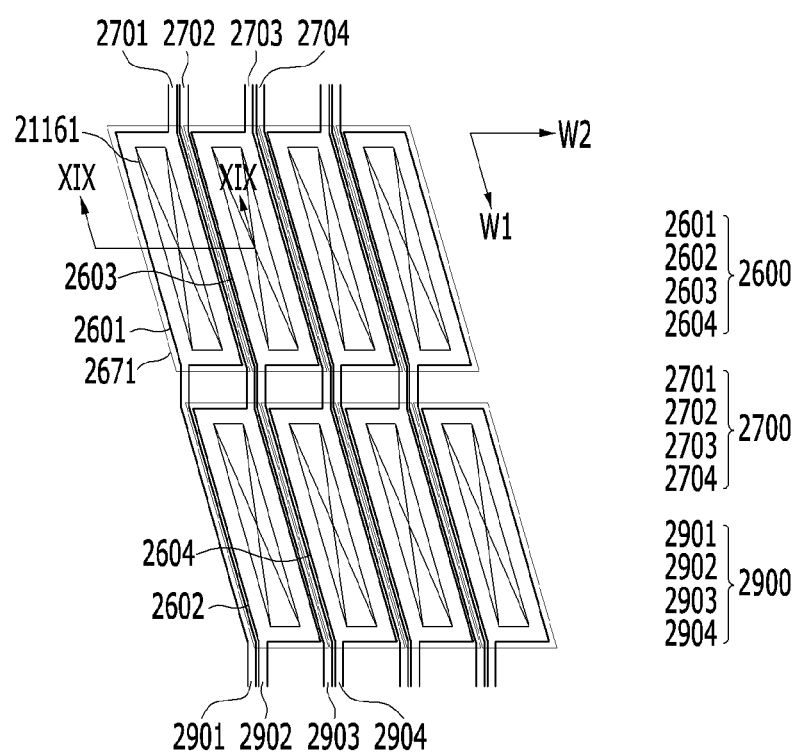
FIG. 18 is a top plan view that illustrates an exemplary embodiment of a pad portion of a display device.
Figure 19:
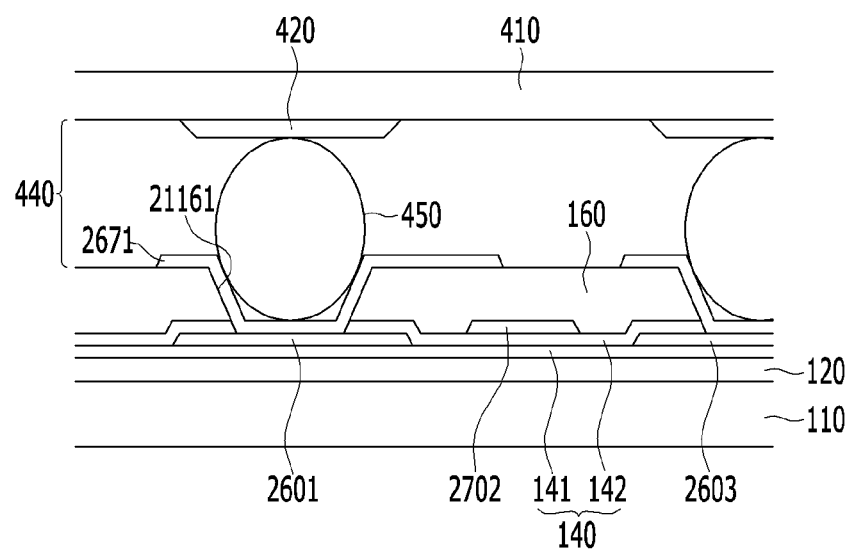
FIG. 19 is a cross-sectional view of FIG. 18, taken along line XIX-XIX.

A display device according to an exemplary embodiment of FIGS. 18 and 19 is substantially the same as the display device according to the exemplary embodiment of FIGS. 1 to 14, and therefore no duplicated description will be provided. The illustrated exemplary embodiment of FIGS. 18 and 19 is different from the exemplary embodiment of FIGS. 1 to 14 in that a plurality data pads are arranged in two rows, and this will be described in detail.

FIG. 18 is a top plan view that partially illustrates a pad area of a display device according to an exemplary embodiment, and FIG. 19 is a cross-sectional view of FIG. 18, taken along line XIX-XIX.

As shown in FIGS. 18 and 19, a plurality of data pads 2600 are arranged in a first direction W1 and a second direction W2 in the pad area of the display device. In this case, the plurality of data pads 2600 may be arranged in two rows.

The plurality of data pads 2600 include a first data pad 2601 and a third data pad 2603 that are disposed in the first row, and a second data pad 2062 and a fourth data pad 2604 that are disposed in the second row.

The first data pad 2601 and the second data pad 2602 are disposed adjacent to each other along the first direction W1, and they are respectively disposed in different layers. The first data pad 2601 is connected with a first connection wire 2701 and a first test wire 2901, and they are disposed in the same layer. The second data pad 2602 is connected with a second connection wire 2702 and a second test wire 2902, and they are disposed in the same layer.

The first data pad 2601 and the third data pad 2603 are disposed adjacent to each other along the second direction W2, and they are disposed in the same layer. The third data pad 2603 and the fourth data pad 2604 are disposed adjacent to each other along the first direction W1, and they are respectively disposed in different layers. The third data pad 2603 is connected with a third connection wire 2703 and a third test wire 2903, and they are disposed in the same layer. The fourth data pad 2604 is connected with a fourth connection wire 2704 and a fourth test wire 2904, and they are disposed in the same layer.

One wire 2700 or 2900 is disposed between data pads 2600 that are disposed adjacent to each other along the second direction W2 in the same row. In an exemplary embodiment, the second connection wire 2702 is disposed between the first data pad 2601 and the third data pad 2603, for example. The third test wire 2903 is disposed between the second data pad 2602 and the fourth data pad 2604.

Since the first data pad 2601 and the second connection wire 2702 are respectively disposed in different layers, the first data pad 2601 and the second connection wire 2702 are not short-circuited even though a distance therebetween is reduced. Since the second connection wire 2702 and the third data pad 2603 are respectively disposed in different layers, the second connection wire 2702 and the third data pad 2603 are not short-circuited even though a distance therebetween is reduced.

A second gate insulation layer 142 and an interlayer insulation layer 160 are provided on the first data pad 2601. A contact hole 21161 that overlaps at least a part of the first data pad 2601 is provided in the second gate insulation layer 142 and the interlayer insulation layer 160. The contact hole 21161 may overlap a center portion of the first data pad 2601. A first auxiliary data pad 2671 is disposed on the interlayer insulation layer 160. The first auxiliary data pad 2671 is connected with the first data pad 2601 through the contact hole 21161. The first auxiliary data pad 2671 covers a portion of the first data pad 2601, overlapping the contact hole 21161.

It is illustrated that the first auxiliary data pad 2671 overlaps the second connection wire 2702. However, the invention is not limited thereto, and the first auxiliary data pad 2671 may not overlap the second connection wire 2702.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a substrate;
a first connection wire disposed on the substrate and extends according to a first direction;
a second connection wire disposed on the substrate and disposed on a layer different from the first connection wire, wherein no wires are disposed between the second connection wire and the first connection wire in a plan view;
an insulating layer between the first connection wire and the second connection wire; and
a plurality of pads disposed according to the first direction and a second direction,
a first plurality of pads of the plurality of pads adjacent according to the first direction are disposed in different layers, a second plurality of pads of the plurality of pads adjacent according to the second direction are disposed in a same layer, and
the second direction corresponds to a row of the plurality of pads adjacent according to the second direction extending in a horizontal direction parallel to an edge of a plane defining the substrate.

2. The display device of claim 1, wherein the plurality of pads comprising:
a first pad;
a second pad disposed adjacent to the first pad along the first direction;
a third pad disposed adjacent to the first pad along the second direction, such that there is no pad between the first pad and the third pad; and
a fourth pad disposed adjacent to the second pad along the second direction, such that there is no pad between the second pad and the fourth pad,
wherein the first pad and the second pad are disposed in different layers,
the third pad and the fourth pad are disposed in different layers,
the first pad and the third pad are disposed in a first layer, and
the second pad and the fourth pad are disposed in a second layer.

3. The display device of claim 2,
wherein the first connection wire is disposed in the first layer, and the second connection wire is disposed in the second layer.

4. The display device of claim 3, wherein the plurality of pads further comprising:
a fifth pad disposed adjacent to the second pad along the first direction; and
a sixth pad disposed adjacent to the fifth pad along the first direction,
wherein the fifth pad is disposed in the first layer, and the sixth pad is disposed in the second layer.

5. The display device of claim 4, further comprising:
a fifth connection wire connected to the third pad; and
a sixth connection wire connected to the fourth pad,
wherein the fifth connection wire is disposed in the first layer, and the sixth connection wire is disposed in the second layer.

6. The display device of claim 5, wherein
the fifth connection wire is disposed between the second connection wire and the sixth connection wire.

7. The display device of claim 5, wherein
the second connection wire is disposed between the first pad and the fifth connection wire.

8. The display device of claim 4, wherein the plurality of pads further comprising:
a seventh pad disposed adjacent to the fifth pad along the second direction, such that there is no pad between the fifth pad and the seventh pad; and
an eighth pad disposed adjacent to the sixth pad along the second direction, such that there is no pad between the sixth pad and the eighth pad.

9. A display device comprising:
a substrate;
a first connection wire which extends according to a first direction on the substrate;
a second connection wire disposed on the substrate and disposed on a layer different from the first connection wire, and disposed alternately with the first connection wire on a plane;
an insulating layer between the first connection wire and the second connection wire;
a plurality of pads disposed according to the first direction and the second direction,
a semiconductor layer disposed on the substrate;
a first gate electrode disposed on the semiconductor layer;
a first gate insulating layer between the semiconductor layer and the first gate electrode;
a second gate electrode disposed on the first gate electrode; and
a second gate insulating layer between the first gate electrode and the second gate electrode,
wherein
a first plurality of pads of the plurality of pads adjacent according to the first direction are disposed in different layers, and
a second plurality of pads of the plurality of pads adjacent according to the second direction are disposed in a same layer
wherein the plurality of pads comprising:
a first pad;
a second pad disposed adjacent to the first pad along the first direction;
a third pad disposed adjacent to the first pad along the second direction, such that there is no pad between the first pad and the third pad; and
a fourth pad disposed adjacent to the second pad along the second direction, such that there is no pad between the second pad and the fourth pad,
wherein the first pad and the second pad are disposed in different layers,
the third pad and the fourth pad are disposed in different layers,
the first pad and the third pad are disposed in a first layer, and
the second pad and the fourth pad are disposed in a second layer, and
wherein the first gate electrode is disposed in the first layer, and the second gate electrode is disposed in the second layer.

10. A display device comprising:
a substrate;
a first connection wire which extends according to a first direction on the substrate;
a second connection wire which is disposed on the substrate and disposed on a layer different from the first connection wire and is disposed alternately with the first connection wire on a plane;
an insulating layer between the first connection wire and the second connection wire; and
a plurality of pads
disposed according to the first direction and a second direction which is different from the first direction,
a first plurality of pads of the plurality of pads adjacent according to the first direction are disposed in different layers, and
a second plurality of pads of the plurality of pads adjacent according to the second direction are disposed in a same layer,
wherein the plurality of pads comprising:
a first pad;
a second pad disposed adjacent to the first pad along the first direction;
a third pad disposed adjacent to the first pad along the second direction, such that there is no pad between the first pad and the third pad;
a fourth pad disposed adjacent to the second pad along the second direction, such that there is no pad between the second pad and the fourth pad
a fifth pad disposed adjacent to the second pad along the first direction; and
a sixth pad disposed adjacent to the fifth pad along the first direction,
wherein the first pad, the third pad, and the fifth pad are disposed in a first layer, and
the second pad, the fourth pad, and the sixth pad are disposed in a second layer different from the first layer.

* * * * *